(12) United States Patent
Klayman

(10) Patent No.: US 7,778,427 B2
(45) Date of Patent: Aug. 17, 2010

(54) PHASE COMPENSATION TECHNIQUES TO ADJUST FOR SPEAKER DEFICIENCIES

(75) Inventor: Arnold I. Klayman, Huntington Beach, CA (US)

(73) Assignee: SRS Labs, Inc., Santa Ana, CA (US)

( * ) Notice: Subject to any disclaimer, the term of this patent is extended or adjusted under 35 U.S.C. 154(b) by 1262 days.

(21) Appl. No.: 11/326,048

(22) Filed: Jan. 4, 2006

(65) Prior Publication Data

US 2006/0147056 A1    Jul. 6, 2006

Related U.S. Application Data

(60) Provisional application No. 60/641,380, filed on Jan. 5, 2005.

(51) Int. Cl.
*H04R 1/40*    (2006.01)

(52) U.S. Cl. ................. 381/97; 381/1; 381/17

(58) Field of Classification Search ............ 381/1, 381/17–19, 97, 98, 10, 300, 303
See application file for complete search history.

(56) References Cited

U.S. PATENT DOCUMENTS

| | | | |
|---|---|---|---|
| 3,930,561 A | 1/1976 | Klayman | |
| 4,323,731 A | 4/1982 | Hershberger | |
| 4,482,866 A | 11/1984 | Crooks | |
| 4,748,669 A | 5/1988 | Klayman | |
| 4,819,269 A | 4/1989 | Klayman | |
| 4,836,329 A | 6/1989 | Klayman | |
| 4,841,572 A | 6/1989 | Klayman | |
| 4,866,774 A | 9/1989 | Klayman | |
| 5,319,713 A | 6/1994 | Waller et al. | |
| 5,333,201 A | 7/1994 | Waller | |
| 5,459,813 A | 10/1995 | Klayman | |
| 5,638,452 A | 6/1997 | Waller | |
| 5,661,808 A | 8/1997 | Klayman | |
| 5,771,295 A | 6/1998 | Waller | |
| 5,784,468 A | 7/1998 | Klayman | |
| 5,850,453 A | 12/1998 | Klayman | |
| D408,818 S | 4/1999 | Klayman | |
| 5,892,830 A | 4/1999 | Klayman | |
| 5,912,976 A | 6/1999 | Klayman | |
| 5,970,152 A | 10/1999 | Klayman | |
| 6,111,958 A * | 8/2000 | Maher .................... | 381/17 |
| D435,842 S | 1/2001 | Klayman | |
| 6,281,749 B1 | 8/2001 | Klayman et al. | |
| 6,285,767 B1 | 9/2001 | Klayman | |
| 6,590,983 B1 | 7/2003 | Kraemer | |
| 6,597,791 B1 | 7/2003 | Klayman | |

(Continued)

FOREIGN PATENT DOCUMENTS

WO    WO 2005/062673    7/2005

*Primary Examiner*—Vivian Chin
*Assistant Examiner*—Jason R Kurr
(74) *Attorney, Agent, or Firm*—Knobbe Martens Olson & Bear, LLP.

(57) ABSTRACT

In an embodiment, a phase compensation system shifts the phase of an audio signal in a mid-range frequency band to compensate for phase distortion created when an electrical audio signal is converted to audio by an electronic transducer, such as a loudspeaker. An audio enhancement system mixes at least the phase compensated signal, an enhanced audio signal, and the left and right audio input signals to generated phase compensated left and right audio output signals.

8 Claims, 18 Drawing Sheets

U.S. PATENT DOCUMENTS

| | | |
|---|---|---|
| 6,690,799 B1 * | 2/2004 | Iwase et al. .................. 381/17 |
| 6,718,039 B1 | 4/2004 | Klayman |
| 7,382,888 B2 * | 6/2008 | Aylward et al. .............. 381/97 |
| 2002/0129151 A1 | 9/2002 | Yuen et al. |
| 2004/0005063 A1 | 1/2004 | Klayman |
| 2004/0247132 A1 | 12/2004 | Klayman et al. |
| 2005/0071028 A1 | 3/2005 | Yuen et al. |
| 2005/0129248 A1 | 6/2005 | Kraemer et al. |
| 2005/0246179 A1 | 11/2005 | Kraemer |
| 2006/0188101 A1 * | 8/2006 | Gunnarsson .................. 381/1 |

* cited by examiner

PHASE COMPENSATION TECHNIQUES TO ADJUST FOR SPEAKER DEFICIENCIES

The present application claims priority benefits under 35 U.S.C. 119(e) from U.S. Provisional Application No. 60/641,380, filed Jan. 5, 2005, titled "Phase Compensation Techniques To Adjust For Speaker Deficiencies", which is hereby incorporated herein in its entirety by reference.

BACKGROUND OF THE INVENTION

1. Field of the Invention

This invention relates generally to audio enhancement and more particularly to systems and methods to enhance audio signals to compensate for phase distortion.

2. Description of the Related Art

When voice or music is reproduced through transducers, such as loudspeakers, which exhibit both spring and mass in their construction, the transducers produce phase shifting of the audio signal throughout the frequency spectrum within which the transducers operate.

Ideally, the cone of a loudspeaker operates as a unit. At a frequency determined by the design of the loudspeaker, the cone propagates a radial wave outward from the voice coil region to the surround region. The loudspeaker delays higher frequency waves with respect to lower frequency waves. In an embodiment, the amount of delay is dependent on the speed of sound permitted by the speaker material. The delay produces phase shifting throughout the frequency spectrum within which the transducers operate.

This has been realized by loudspeaker manufacturers, but little can be done in the manufacturing process to alleviate this problem. Components of speakers, such as cones and diaphragms, have mass. Speaker centering and restoring devices, such as spiders and surrounds, exhibit spring constants. Further, air itself exhibits a spring constant. This combination produces phase shifting throughout the frequency range.

The phase shifting produces significant changes in the waveform, which the transducer is attempting to reproduce. The result is a phase distortion of the audio signal, which is distinctly audible.

SUMMARY OF THE INVENTION

Innovative systems and methods are described to correct phase distortion over all or a portion of the audible frequency spectrum when an electrical audio signal is converted to audio by an electromagnetic transducer, such as a loud speaker, and heard by a listener. In an embodiment, the phase of an audio signal over the audible frequency range is modified such that when the phase of the modified audio signal is distorted by the loudspeakers, the phase modification of the audio signal and the phase distortion of the audio signal largely cancel.

Loudspeaker transducers produce phase distortion by displacing or delaying higher frequencies from lower frequencies. By filtering the input to the loudspeaker using filters, which shift the phase in the opposite direction from that of the loudspeaker, the acoustic output of the loudspeaker can be corrected. In an embodiment, the filter is an all-pass filter, which shifts phase, but does not substantially alter the amplitude of the signal. The specific implementation of the filter is dependent on the type of correction desired. In an embodiment, the phase compensation system phase shifts the left and right audio signals. In another embodiment, the phase compensation system phase shifts the sum information of the left and right audio signals.

In an embodiment, an audio enhancement system combines an enhanced audio signal, a signal comprising difference information in the left and right audio input signals, a phase compensated signal, and the left audio input signal to create a left audio output signal. The audio enhancement system further combines the enhanced audio signal, the signal comprising difference information in the left and right audio input signals, the phase compensated signal, and the right audio input signal to create a right audio output signal. In an embodiment, the phase compensated signal is a phase compensated sum signal comprising phase compensated sum information of the left and right audio input signals. In another embodiment, the phase compensated signal is a phase compensated left or right audio signal.

In another embodiment, a phase compensation system for substantially correcting phase distortion of sound reproduced by at least one loudspeaker comprises a low-pass filter in communication with an input signal and configured to modify the input signal as a function of frequency over a first frequency range within the input signal to create a first frequency corrected signal, a high-pass filter in communication with the input signal and configured to modify the input signal as a function of frequency over a second frequency range within the input signal to create a second frequency corrected signal, an all-pass filter in communication with the input signal and configured to shift the phase of the input signal as a function of frequency over a third frequency range within the input signal to create a third frequency corrected signal, and an adder that combines the first frequency corrected signal, the second frequency corrected signal, and the third frequency corrected signal to create a phase compensated signal. In an embodiment, the input signal is a signal comprising sum information of a left audio input signal and a right audio input signal.

In an embodiment, the phase compensation system further comprises a second low-pass filter in communication with a right audio input signal and configured to modify the right audio input signal as a function of frequency over the first frequency range within the right audio input signal to create a first right frequency corrected signal, a second high-pass filter in communication with the right audio input signal and configured to modify the right audio input signal as a function of frequency over the second frequency range within the right audio input signal to create a second right frequency corrected signal, a second all-pass filter in communication with the right audio input signal and configured to shift the phase of the right audio input signal as a function of frequency over the third frequency range within the right audio input signal to create a third right frequency corrected signal, and a second adder that combines the first right frequency corrected signal, the second right frequency corrected signal, and the third right frequency corrected signal to create a right phase compensated signal, wherein the input signal is a left audio input signal, the first frequency corrected signal is a first left frequency corrected signal, the second frequency corrected signal, is a second left frequency corrected signal, the third frequency corrected signal is a third left frequency corrected signal, and the phase compensated signal is a left phase compensated signal.

In an embodiment, the all-pass filter comprises a first all-pass filter connected in series with a second all-pass filter. In another embodiment, the all-pass filter comprises a first all-pass filter, a second all-pass filter, and a third all-pass filter connected in series.

In a further embodiment, a method for substantially correcting phase distortion of sound reproduced by at least one loudspeaker comprises low-pass filtering an input signal to modify the input signal as a function of frequency over a first frequency range within the input signal to create a first frequency corrected signal, high-pass filtering the input signal to modify the input signal as a function of frequency over a second frequency range within the input signal to create a second frequency corrected signal, all-pass filtering the input signal to phase shift the input signal as a function of frequency over a third frequency range within the input signal to create a third frequency corrected signal, and combining the first frequency corrected signal, the second frequency corrected signal, and the third frequency corrected signal to create a phase compensated signal.

In yet another embodiment, a phase compensation system for substantially correcting phase distortion of sound reproduced by at least one loudspeaker comprises means for low-pass filtering an input signal as a function of frequency over a first frequency range within the input signal to create a first frequency corrected signal, means for high-pass filtering the input signal as a function of frequency over a second frequency range within the input signal to create a second frequency corrected signal, means for all-pass filtering the input signal as a function of frequency over a third frequency range within the input signal to create a third frequency corrected signal, and means for combining the first frequency corrected signal, the second frequency corrected signal, and the third frequency corrected signal to create a phase compensated signal.

For purposes of summarizing the invention, certain aspects, advantages and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements. In addition, the first digit of each reference number indicates the figure in which the element first appears.

FIGS. 9, 9A, 9B, and 9C are a schematic illustrating an embodiment of a phase compensation system.

DETAILED DESCRIPTION OF THE PREFERRED EMBODIMENT

Figure 1:
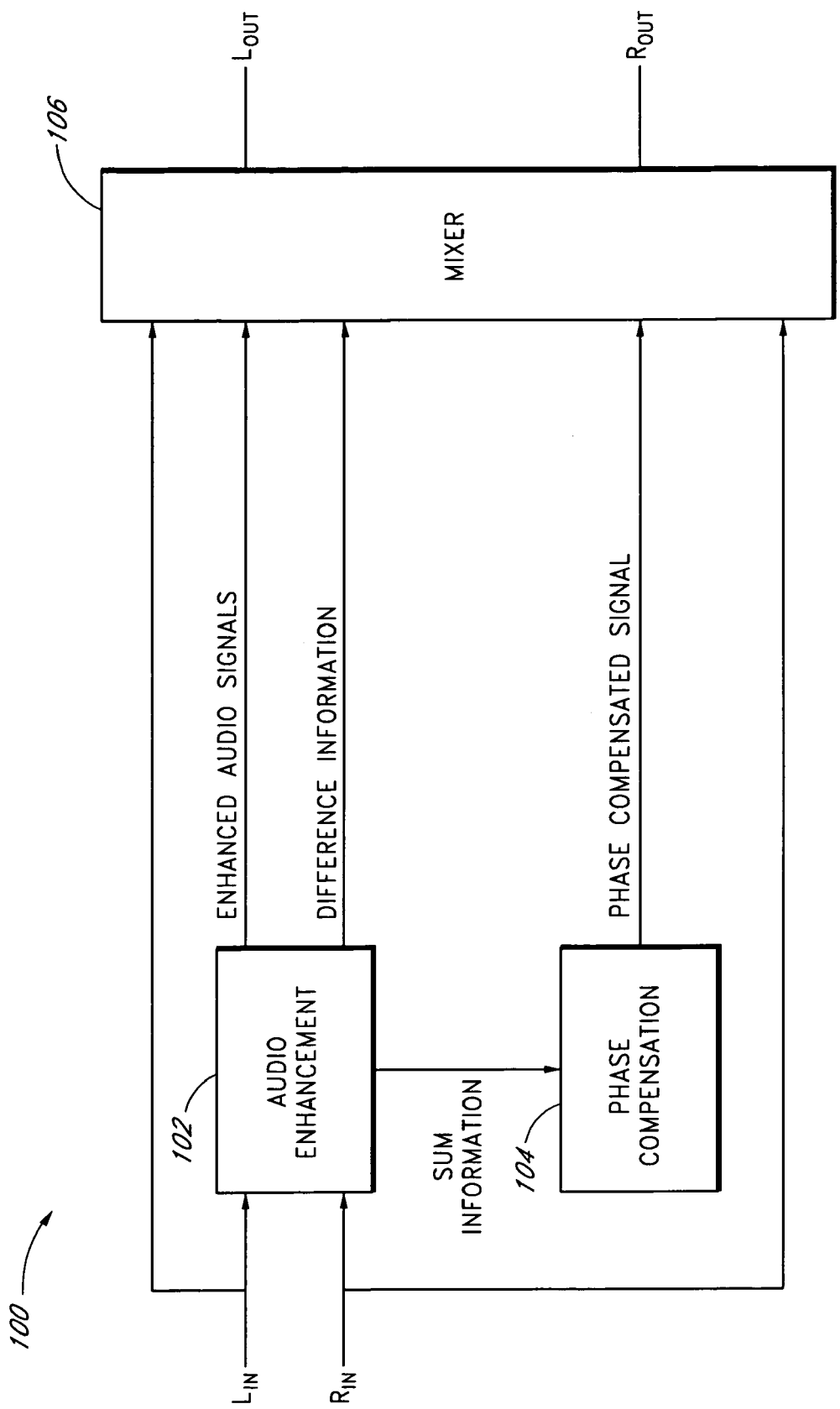
FIG. 1 is a block diagram illustrating an embodiment of an audio enhancement system comprising phase compensation.

For a more detailed understanding of the invention, reference is first made to FIG. 1. FIG. 1 illustrates an embodiment of an audio enhancement system 100. In an embodiment, the audio enhancement system 100 comprises an audio enhancement circuit 102, a phase compensation circuit 104, and a mixer 106. The audio enhancement circuit 102 inputs a left audio input signal $L_{IN}$ and a right audio input signal $R_{IN}$ and produces at least one enhanced audio signal, difference information, and sum information.

The audio enhancement circuit 102 conditions the stereo signal, $L_{IN}$, $R_{IN}$, to broaden the stereo image emanating from the sound source. The difference information represents the stereo content of the left audio input signal $L_{IN}$ and the right audio input signal $R_{IN}$, and can be produced by subtracting the right audio input signal $R_{IN}$ from the left audio input signal $L_{IN}$ (L−R) or by subtracting the left audio input signal $L_{IN}$ from the right audio input signal $R_{IN}$ (R−L). The sum information (R+L) represents the sum of the left audio input signal $L_{IN}$ and the right audio input signal $R_{IN}$.

The phase compensation circuit 104 receives the sum information (R+L) and processes the sum information (R+L) to produce a phase compensated signal.

The mixer 106 receives the left audio input signal $L_{IN}$, the right audio input signal $R_{IN}$, the enhanced audio signal, the difference information (R−L), (L−R), the sum information (R+L), and the phase compensated signal, and produces a left audio output signal $L_{OUT}$ and a right audio output signal $R_{OUT}$. The audio output signals $L_{OUT}$, and $R_{OUT}$, can be connected to another signal conditioning circuit or they can be connected directly to speakers. The audio enhancement system 100 shifts the phase of the audio signal in the opposite direct from that of the loudspeakers, such that when the audio signal is played through the speaker, the phase shift due to the audio enhancement system 100 and the phase shift due to the speaker largely cancel. Through the application of the audio enhancement system 100, the stereo image generated by playing the audio output signals, $L_{OUT}$ and $R_{OUT}$, through the speakers is substantially free of the phase distortion caused by the speakers.

Figure 2:
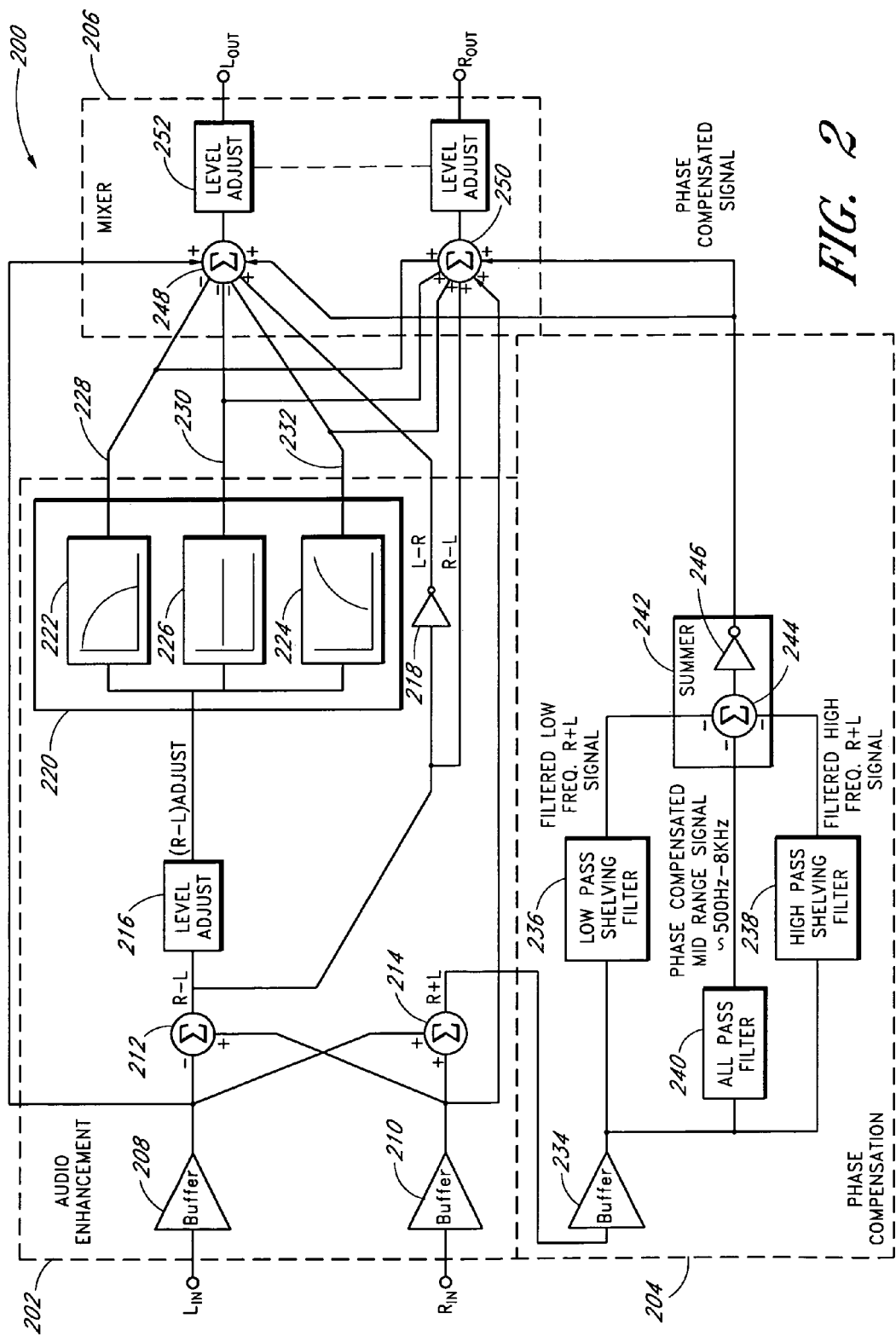
FIG. 2 is a detailed block diagram illustrating another embodiment of an audio enhancement system comprising phase compensation.

FIG. 2 illustrates an embodiment of an audio enhancement apparatus 200 comprising an audio enhancement circuit 202, a phase compensation circuit 204, and a mixer 206. In an embodiment, the audio enhancement circuit 204 generates difference information comprising the difference of the left and the right audio input signals (R−L) and the difference of the right and the left audio input signals (L−R), and sum information comprising the sum of the left and the right audio input signals (R+L). The audio enhancement circuit 202 filters the difference between the left and right audio input signals (R−L) to generate enhanced audio signals.

In a preferred embodiment, the audio enhancement system 202 equalizes the difference signal information present in the left and right audio input signals $L_{IN}$ and $R_{IN}$. The stereo enhancement system 202 disclosed herein is similar to that disclosed in U.S. Pat. No. 4,748,669, which is hereby incorporated herein in its entirety by reference.

Although the embodiments of the phase compensation system are described herein with reference to one audio enhancement system, the invention is not so limited, and can be used in a variety of other contexts in which it is desirable to adapt different embodiments of the phase compensation system to different situations.

Referring to FIG. 2, the audio enhancement circuit 202 comprises a left buffer 208, a right buffer 210, a combiner 212, an adder 214, an optional level adjust 216, an inverter 218, a stereo enhancement equalizer 220. The left buffer 208 receives the left audio input signal $L_{IN}$ and buffers the input signal $L_{IN}$ to produce a buffered left input signal. Similarly, the right buffer 210 receives the right audio input signal $R_{IN}$ and buffers the input signal $R_{IN}$ to produce a buffered right input signal. The adder 214 receives the buffered input signals and combines the buffered input signals to produce sum information (R+L).

The combiner 212 receives the buffered input signals and subtracts the left buffered input signal from the right buffered input signal to produce the difference information (R−L). The inverter 218 receives the difference information (R−L) and inverts the signal to generate the difference information (L−R), which represents the signal created by subtracting the right buffered input signal from the left buffered input signal. The difference information (R−L) and (L−R) both represent the stereo content of the left and right input signal, where the phase of the difference information (R−L) is opposite or approximately 180° from the phase of the difference information (L−R).

The difference information (R−L) inputs to the level adjust 216 to adjust the base level of the difference information (R−L) present in the output signals. The level adjust 216 outputs an adjusted difference signal $(R-L)_{adjusted}$, which is received by the stereo enhancement equalizer 220.

The stereo enhancement equalizer 220 equalizes the difference signal by separately applying a low-pass filter 222, and a high pass filter 224 to the adjusted difference signal $(R-L)_{adjusted}$. In addition to the conditioning provided by the filters 222, 224, the difference signal level is separately adjusted by applying a stereo orientation circuit 226 to the adjusted difference signal $(R-L)_{adjusted}$. The stereo enhancement equalizer 220 produces a low frequency enhanced audio signal, a level adjusted enhanced audio signal, and a high frequency enhanced audio signal, along paths 228, 230, and 232 respectively. The low frequency enhanced audio signal, the level adjusted enhanced audio signal, and the high frequency enhanced audio signal are collectively referred to as the enhanced audio signals.

The phase compensation circuit 204 receives the sum information (R+L). In an embodiment, the phase compensation circuit 202 comprises a buffer 234, a low-pass filter 236, and a high-pass filter 238. The buffer 234 in the phase compensation circuit 202 receives the sum information (R+L) and buffers the sum information (R+L) to produce buffered sum information.

The low-pass filter 236 receives the buffered sum signal. The low-pass filter 236 filters the buffered sum signal to produce a filtered low frequency sum signal in a first frequency range. In an embodiment, the low-pass filter 236 is a low-pass shelving filter 236. In an embodiment, the first frequency range is approximately 20 Hz to approximately 500 Hz.

The high-pass filter 238 also receives the buffered sum signal. The high-pass filter 238 filters the buffered sum signal to produce a filtered high frequency sum signal in a second frequency range. In an embodiment, the high-pass filter is a high-pass shelving filter. In an embodiment, the second frequency range is approximately 8 kHz to approximately 20 kHz.

The phase compensation circuit 204 further comprises an all-pass filter 240. In an embodiment, the all-pass filter comprises two all-pass filters connected in series. In another embodiment, the all-pass filter comprises three all-pass filters connected in series. The all-pass filter 240 receives the buffered sum signal and phase shifts the buffered sum signal in a third frequency range to produce a phase compensated mid-frequency range sum signal. In an embodiment, the third frequency range is approximately 500 Hz to approximately 8 kHz. In another embodiment, the third frequency range is approximately 300 Hz to approximately 20 kHz. In yet another embodiment, the third frequency range is approximately 300 Hz to approximately 48.5 kHz.

The phase compensation circuit 204 further comprises a combining circuit 242. The combining circuit 242 receives the low frequency sum signal from the low-pass filter 236, the high frequency sum signal from the high-pass filter 238, and the frequency compensated mid-frequency range signal from the all-pass filter 240. The combining circuit 242 combines the low frequency sum signal, the high frequency sum signal, and the phase compensated mid-frequency range sum signal to produce a phase compensated signal.

In an embodiment, the combining circuit 242 comprises a subtracting circuit 244, which subtracts each of the low frequency sum signal, the high frequency sum signal, and the phase compensated mid-frequency range sum signal, and a phase inverting circuit 246, which inverts the phase of output of the subtracting circuit 244 to produce the phase compensated signal.

The mixer 206 receives the enhanced audio signals, the difference information (R−L), the difference information (L−R), the phase compensated signal, the left audio input signal $L_{IN}$ and the right audio input signal $R_{IN}$. In an embodiment, the mixer 206 comprises a first combining circuit 248 and a second combining circuit 250.

The first combining circuit 248 receives the enhanced audio signals, the difference information (L−R), the phase compensated signal, and the left audio input signal $L_{IN}$ and combines the signals to produce the left output signal $L_{OUT}$. In an embodiment, the first combining circuit 248 subtracts the enhanced audio signals and adds the difference information (L−R), the phase compensated signal, and the left audio input $L_{IN}$ to produce the left output signal $L_{OUT}$.

The second combining circuit 250 receives the enhanced audio signals, the difference information (R−L), the phase compensated signal, and the right audio input signal $R_{IN}$ and combines the signals to produce the right output signal $R_{OUT}$. In an embodiment, the second combining circuit 250 adds the enhanced audio signals, the difference information (R−L), the phase compensated signal, and the right audio input signal $R_{IN}$ to produce the right output signal $R_{OUT}$.

In an embodiment, the mixer 206 further comprises an optional level adjust 252 to adjust the base level of the output signals $L_{OUT}$ and $R_{OUT}$ to the user's preference. The left and right audio output signals $L_{OUT}$ and $R_{OUT}$ substantially correct the phase distortion generated by at least one loudspeaker when the left and right audio output signals are audibly reproduced by the at least one loudspeaker and perceived by a listener.

Figure 3:
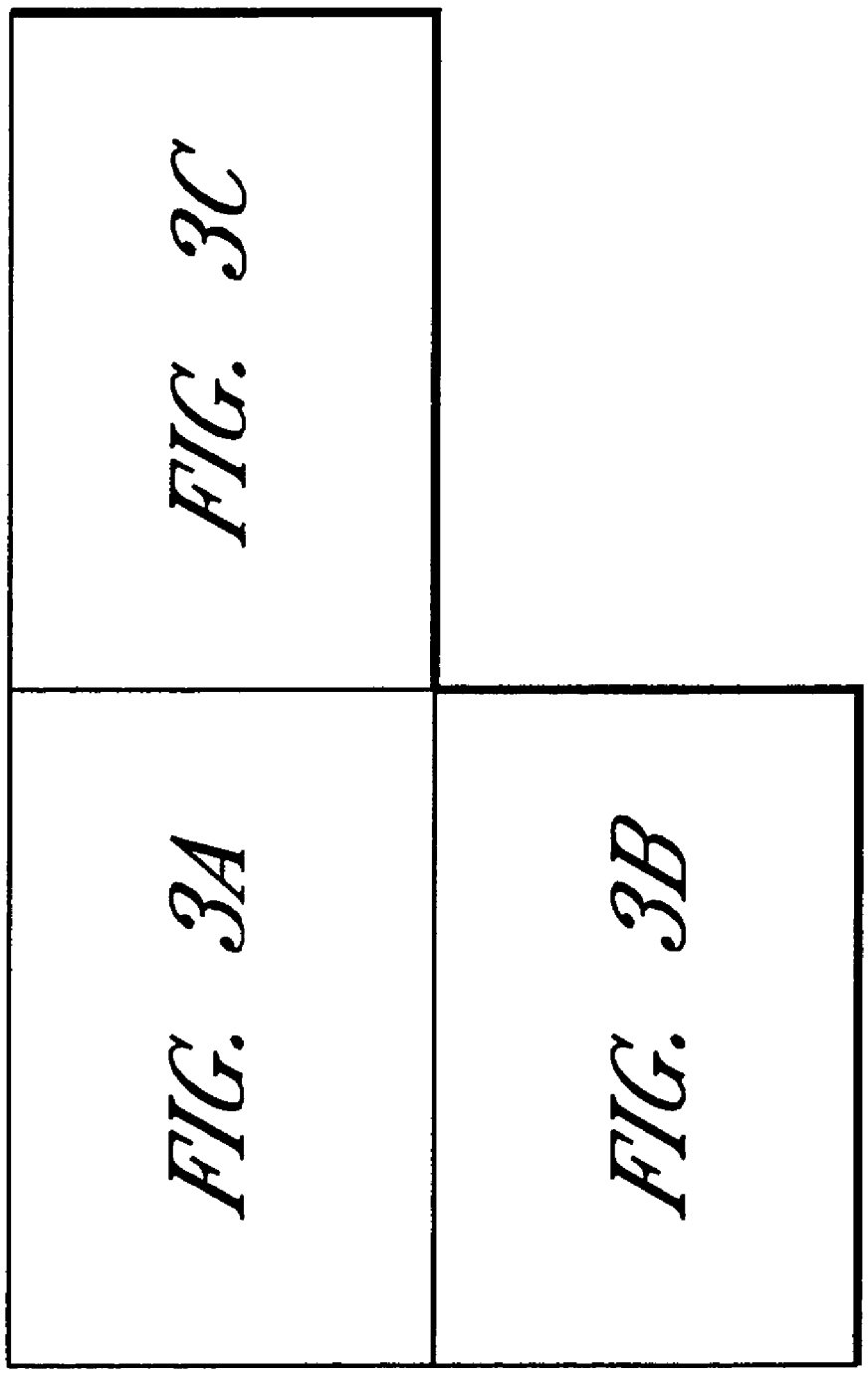
FIGS. 3, 3A, 3B, and 3C are a schematic illustrating an embodiment of an audio enhancement system comprising phase compensation.
Figure 3A:
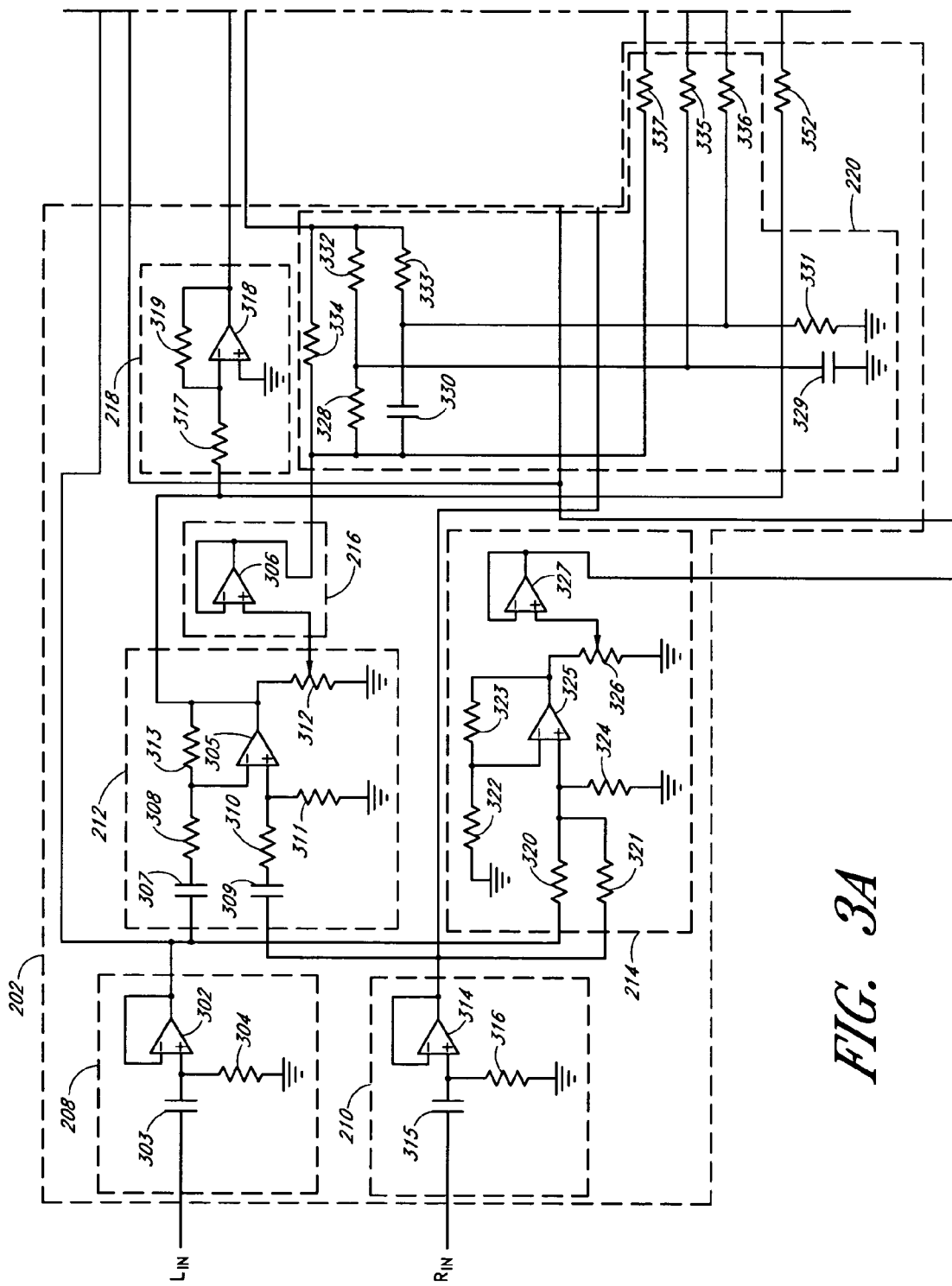

FIGS. 3, 3A, 3B, 3C are a schematic diagram of an embodiment of the audio enhancement system 200 comprising the audio enhancement circuit 202, the phase compensation circuit 204, and the mixer 206. Referring to FIG. 3A, the audio enhancement circuit 202 receives the left audio input $L_{IN}$ and transfers the left audio input $L_{IN}$ to the left buffer circuit 208 comprising an amplifier 302, a capacitor 303, and a resistor 304.

The left buffer circuit 208 buffers the left audio input signal $L_{IN}$ and adjusts the signal level for processing by the audio enhancement circuit 202. A first end of capacitor 303 receives the left audio input signal $L_{IN}$. A second end of the capacitor 303 connects to a non-inverting input of the amplifier 302 and to a first end of the resistor 304. A second end of the resistor 304 connects to ground. An output of the amplifier 302 connects to an inverting input of the amplifier 302 and to the mixer 206 on FIG. 3C, the combiner 212, and the adder 214. In an embodiment, the amplifier 302 is an operational amplifier, such as a low noise JFET TL074A operational amplifier, or the like, the capacitor 303 has a value of 4.7 μFD, and the resistor 304 has a value of 100 KΩ.

The audio enhancement circuit 202 receives the right audio input $R_{IN}$ and transfers the right audio input $R_{IN}$ to the right buffer circuit 210 comprising an amplifier 314, a capacitor 315, and a resistor 316. The right buffer circuit 210 buffers the right audio input signal $R_{IN}$ and adjusts the signal level for processing by the audio enhancement circuit 202. A first end of capacitor 315 receives the right audio input signal $R_{IN}$. A second end of the capacitor 315 connects to a non-inverting input of the amplifier 314 and to a first end of the resistor 316. A second end of the resistor 316 connects to ground. An output of the amplifier 314 connects to an inverting input of the amplifier 314 and to the mixer 206 on FIG. 3C, the combiner 212, and the adder 214. In an embodiment, the amplifier 314 is an operational amplifier, such as a low noise JFET TL074A operational amplifier, or the like, the capacitor 315 has a value of 4.7 μFD, and the resistor 316 has a value of 100 KΩ.

The outputs of the amplifiers 302, 314 input to the combiner 212, which comprises an amplifier 305, capacitors 307, 309, and resistors 308, 310, 311. A first end of the capacitor 307 receives the output of the amplifier 302. A second end of the capacitor 307 connects to a first end of the resistor 308. A second end of the resistor 308 connects to a first end of the resistor 313 and an inverting input of the amplifier 305.

A first end of the capacitor 309 receives the output of the amplifier 314. A second end of the capacitor 309 connects to a first end of the resistor 310. A second end of the resistor 310 connects to a first end of the resistor 313, a non-inverting input of the amplifier 305 and a first end of the resistor 311. The second end of the resistor 311 connects to ground. The output of the amplifier 305 connects to a second end of the resistor 313, the level adjust 216, and the inverter 218. The combiner circuit 212 subtracts the right stereo signal from the left stereo signal to produce the difference information (R–L).

In an embodiment, the capacitors 307, 309 each have a value of 0.1 μFD, the resistors 308, 310 each have a value of 33.2 KΩ, the resistors 311, 313 each have a value of 66.5 KΩ, and the amplifier 305 is an operational amplifier, such as a low noise JFET TL074A operational amplifier, or the like.

The level adjust 216, comprising an amplifier 306 and a variable resistor 312, receives the output of the amplifier 305. The output of the amplifier 305 inputs to a third terminal of the variable resistor 312. A first terminal of the variable resistor 312 connects to ground and the wiper terminal of the variable resistor 312 connects to a non-inverting input of the amplifier 306. The output of the amplifier 306 connects to the inverting input of the amplifier 306 and the stereo enhancement equalizer 220.

The variable resistor 312 can be adjusted to vary the amount of difference information (R–L) or stereo content input to the stereo enhancement equalizer 220. In an embodiment, the amplifier 306 is an operational amplifier, such as a low noise JFET TL074A operational amplifier, or the like, and the variable resistor 312 is a 5 KΩ linear track resistor, or the like.

The stereo enhancement equalizer 220 receives difference information from the level adjust circuit 216. In an embodiment, the stereo enhancement equalizer conditions the difference information (R–L). In another embodiment, the stereo enhancement equalizer conditions the difference information (L–R). The stereo enhancement equalizer spectrally shapes the difference information according to the frequency response of the low-pass filter 222, the high-pass filter, and the stereo orientation circuit 226 to broaden the sound image when the enhanced audio signals are converted to audio by a speaker system and perceived by a listener.

In the embodiment illustrated in FIG. 3, the stereo enhancement equalizer 220 comprises resistors 328, 331-337, and capacitors 329, 330. The output of the amplifier 306 is received by a first end of the resistor 334, a first end of the resistor 328, a first end of the capacitor 330, and a first end of the resistor 337. The second end of the resistor 334 connects to the mixer 206 on FIG. 3C. The second end of the resistor 328 connects to a first end of the resistor 332, a first end of the capacitor 329, and a first end of the resistor 335.

Figure 3B:
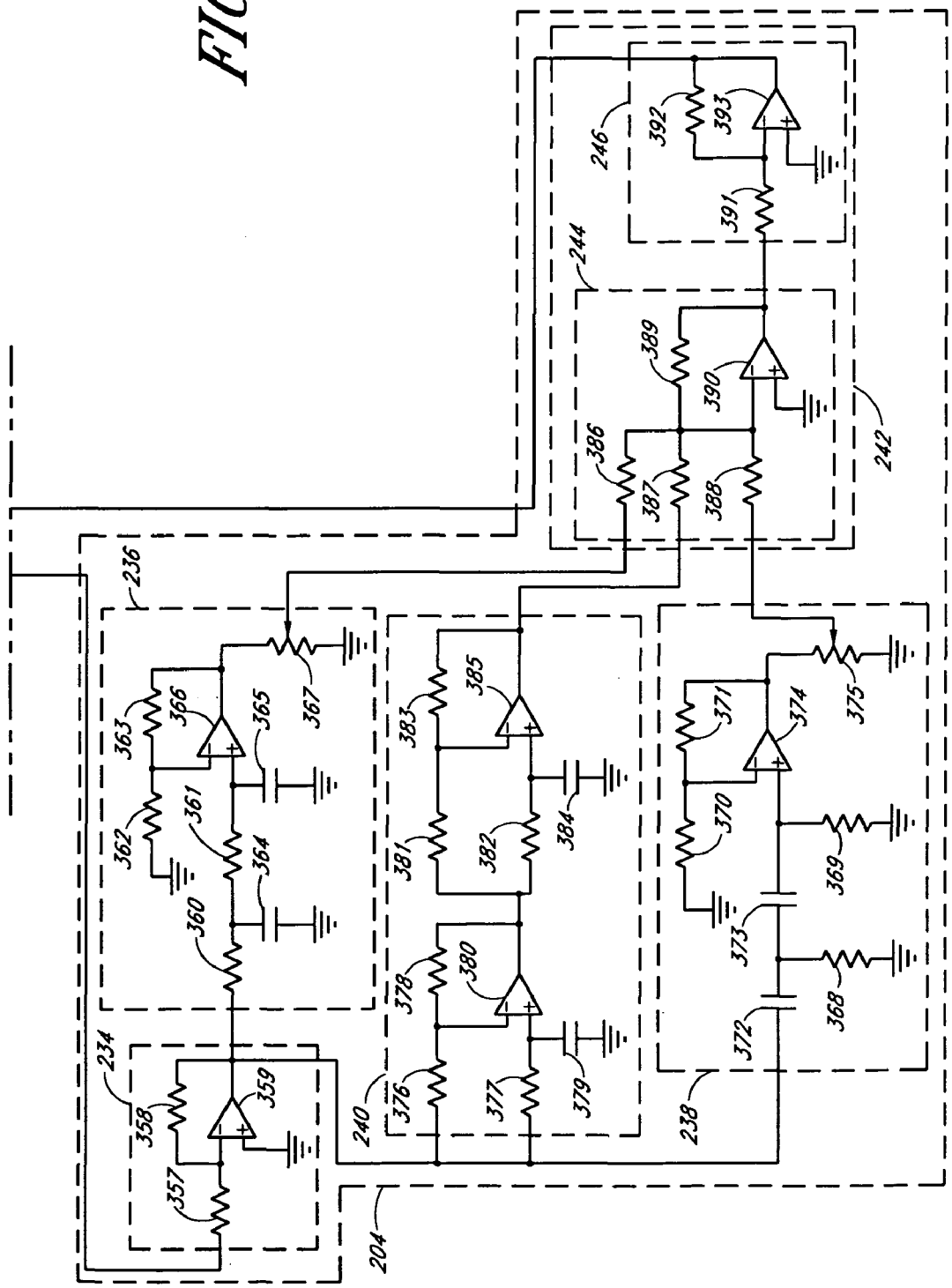
Figure 3C:
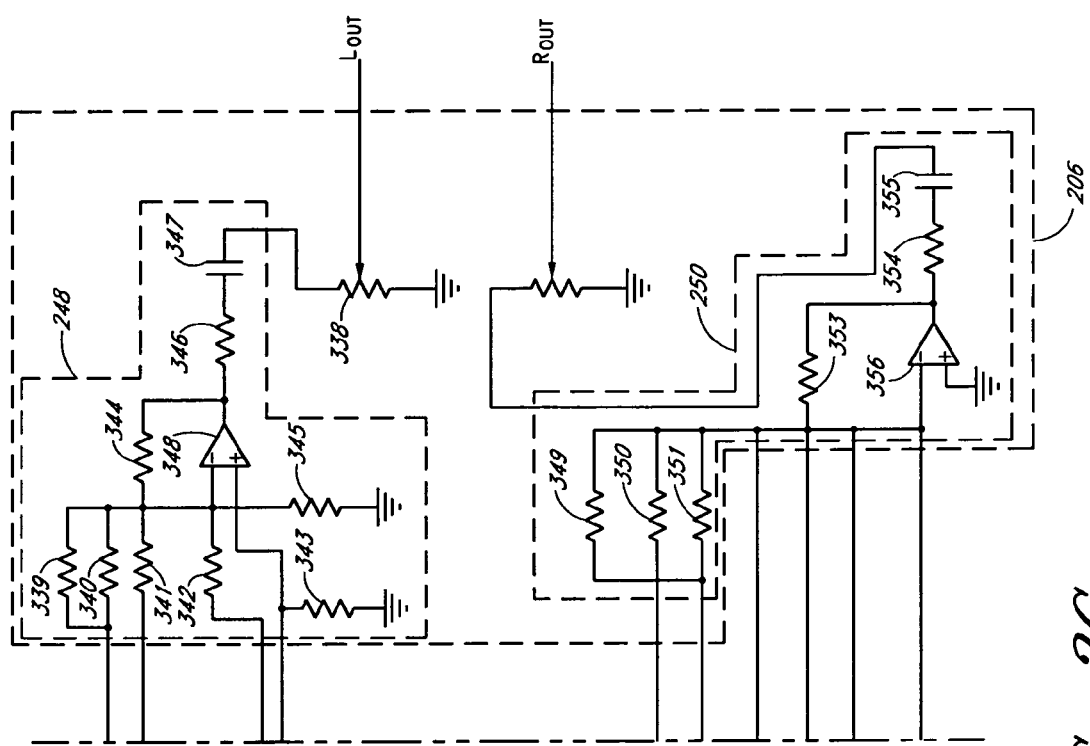

A second end of the resistor 332 and a second end of the resistor 335 connect to the mixer 206 on FIG. 3C. A second end of the capacitor 329 connects to ground. A second end of the capacitor 330 connects to a first end of the resistor 333 a first end of the resistor 331, and a first end of the resistor 336. A second end of the resistor 333 and a second end of the resistor 336 connect to the mixer 206 on FIG. 3C. A second end of the resistor 331 connects to ground. A second end of the resistor 337 connects to the mixer 206 on FIG. 3C.

In the embodiment illustrated in FIG. 3, the resistor 322 has a value of 1.5 KΩ. The resistors 332, 335 each have a value of 33.2 KΩ. The resistors 333, 336 each have a value of 44.2 KΩ. The capacitor 330 has a value of 4700 pFD and the capacitor 329 has a value of 47 μFD. The resistor 337 has a value of 100KΩ. Depending on the type and amount of signal conditioning desired, other circuit values in other embodiments can be used.

The inverter 218, comprising resistors 317, 319, and an amplifier 318, receive the output of the amplifier 305. The output of the amplifier 305 inputs to a first end of the resistor 317. A second end of the resistor 317 connects to a first end of the resistor 319 and an inverting input of the amplifier 318. The non-inverting input of the amplifier 318 connects to ground. The output of the amplifier 318 connects to a second end of the resistor 319 and to the mixer 206 on FIG. 3C. The inverter 218 inverts the difference information signal (R–L) to produce the difference information (L–R). In an embodiment, the amplifier 318 is an operational amplifier, such as a low noise JFET TL074A operational amplifier, or the like, and the resistors 317, 319 each have a value of 10 KΩ.

The adder 214 receives the output of the amplifier 302, which is the buffered left audio input signal, and the output of the amplifier 314, which is the buffered right audio input signal. In the embodiment illustrated in FIG. 3, the adder 214 comprises resistors 320-324, amplifiers 325, 327, and a variable resistor 326. A first end of the resistor 320 receives the output of the amplifier 302 and a first end of the resistor 321 receives the output of the amplifier 314. A second end of the resistor 320 connects to a second end of the resistor 321, a first end of the resistor 324, and a non-inverting input of the amplifier 325. A second end of the resistor 324 connects to ground. An inverting input of the amplifier 325 connects to a first end of the resistor 322 and a first end of the resistor 323. A second end of the resistor 322 connects to ground. An output of the amplifier 325 connects to a second end of the resistor 323 and to a third terminal of the variable resistor 326. A first terminal of the variable resistor 326 connects to ground and a wiper terminal of the variable resistor 326 connects to a non-inverting input of the amplifier 327. The output of the amplifier 327 connects to an inverting input of the amplifier 327 and to the phase compensation circuit 204. The adder 214 adds the buffered left and right input signals to generate the sum information (R+L). The variable resistor 326 can be adjusted to vary the base amount of sum information (R+L) input to the phase compensation circuit 204. In an embodiment, the resistors 320, 321, 323, 324 each have a value of 33.2 KΩ, the resistor 322 has a value of 16.5 KΩ, and the amplifiers 325, 327 are operational amplifiers, such as low noise JFET TL074A operational amplifiers, or the like. In an embodiment, the variable resistor 326 is a 5 KΩ linear track resistor, or the like.

Referring to FIG. 3B, the phase compensation circuit 204 receives the sum information from the output of the amplifier 327 on FIG. 3A, and comprises the buffer 234, the low-pass filter 236, the high-pass filter 238, the all-pass filter 240, and the combiner 242. The buffer 234 comprises resistors 357, 358, and an amplifier 359. A first end of the resistor 357 receives the output of the amplifier 327. A second end of the resistor 357 connects to a first end of the resistor 358 and an inverting input of the amplifier 359. A non-inverting input of the amplifier 359 connects to ground. An output of the amplifier 359 connects to a second end of the resistor 358, to the low-pass filter 236, to the high-pass filter 238, and to the all-pass filer 240. In an embodiment, the resistor 357 has a value of 46.4 KΩ, the resistor 358 has a value of 10 KΩ, and the amplifier 359 is an operational amplifier, such as a low noise JFET TL074A operational amplifier, or the like.

The low-pass filter 236 comprises resistors 360-363, capacitors 364, 365, an amplifier 366, and a variable resistor 367. A first end of the resistor 360 receives the buffered sum signal from the output of the amplifier 359. A second end of the resistor 360 connects to a first end of the resistor 361 and a first end of the capacitor 364. A second end of the resistor 361 connects to a first end of the capacitor 365 and a non-inverting input of the amplifier 366. A second end of the capacitor 364, a second end of the capacitor 365, and a first end of the resistor 362 connect to ground. A second end of the resistor 362 connects to a first end of the resistor 363 and an inverting input of the amplifier 366.

An output of the amplifier 366 connects to a second end of the resistor 363 and a first terminal of the variable resistor 367. A third terminal of the variable resistor 367 connects to ground. A wiper terminal of the variable resistor 367 connects to the summer 244. The variable resistor 367 can be adjusted to vary the base amount of low frequency sum signal present in the phase compensated signal. In an embodiment, the resistors 360-363 have a value of 10 KΩ, the capacitors 364, 365 have a value of 0.039 µFD, and the amplifier 366 is an operational amplifier, such as low noise JFET TL074A operational amplifier, or the like. In an embodiment, the variable resistor 367 is a 5 KΩ linear track resistor, or the like.

The high-pass filter 238 comprises resistors 368-371, capacitors 372, 372, an amplifier 374, and a variable resistor 375. A first end of the capacitor 372 receives the buffered sum signal from the output of the amplifier 359. A second end of the capacitor 359 connects to a first end of the resistor 368 and a first end of the capacitor 373. A second end of the capacitor 373 connects to a first end of the resistor 369 and a non-inverting input of the amplifier 374. A second end of the resistor 368, a second end of the resistor 369, and a first end of the resistor 370 connect to ground. A second end of the resistor 370 connects to a first end of the resistor 371 and to an inverting input of the amplifier 374.

An output of the amplifier 374 connects to a second end of the resistor 71 and to a first terminal of the variable resistor 375. A third terminal of the variable resistor 375 connects to ground, and the wiper terminal of the variable resistor 375 connects to the summer 242. The variable resistor 375 can be adjusted to vary the base amount of high frequency sum signal present in the phase compensated signal. In an embodiment, the resistors 368-371 have a value of 10 KΩ, the capacitors 372, 373 have a value of 0.015 µFD, and the amplifier 374 is an operational amplifier, such as a low noise JFET TL074A operational amplifier, or the like. In an embodiment, the variable resistor 375 is a 5 KΩ linear track resistor, or the like.

The all-pass filter 240 comprises a first all-pass filter connected in series with a second all-pass filter. The first all-pass filter comprises resistors 376-378, a capacitor 379, and an amplifier 380. The second all-pass filter comprises resistors 381-383, a capacitor 384, and an amplifier 385.

A first end of the resistor 376 and a first end of the resistor 377 receive the buffered sum signal from the output of the amplifier 359. A second end of the resistor 377 connects to a first end of the capacitor 379 and a non-inverting input of the amplifier 380. A second end of the capacitor 379 connects to ground. A second end of the resistor 376 connects to a first end of the resistor 378 and a non-inverting input of the amplifier 380.

An output of the amplifier 380 connects to a second end of the resistor 378, a first end of the resistor 381, and a first end of the resistor 382. A second end of the resistor 382 connects to a first end of the capacitor 384 and a non-inverting input of the amplifier 385. A second end of the resistor 381 connects to a first end of the resistor 383. An output of the amplifier 385 connects to a second end of the resistor 383 and to the summer 242.

The first all-pass filter phase shifts the sum signal (R+L) in a first all-pass frequency range to produce a first phase-shifted signal. In an embodiment, the resistors 376, 378 have a value of 100 KΩ, the resistor 377 has a value of 30.1 KΩ, and the capacitor 379 has a value of 0.027 µFD. The amplifier 380 is an operational amplifier, such as a low noise JFET TL074A operational amplifier, or the like. In the embodiment illustrated in FIG. 3, the values are selected so that the first all-pass filter has a corner frequency of approximately 200 Hz and the first all-pass frequency range is approximately 500 Hz to approximately 4 kHz. In other embodiments, different components values can be used, depending on the frequency response characteristics desired.

The second all-pass filter phase shifts the first phase shifted signal in a second all-pass frequency range to produce a phase compensated mid-frequency range sum signal. The output of the second all pass filter is the phase compensated mid-frequency range sum signal. In an embodiment, the resistors 381, 383 have a value of 100 KΩ, the resistor 382 has a value of 18.2 KΩ, and the capacitor 384 has a value of 4700 pFD. The amplifier 385 is an operational amplifier, such as a low noise JFET TL074A operational amplifier, or the like. In the embodiment illustrated in FIG. 3, the values are selected so that the second all-pass filter has a corner frequency of approximately 1.67 kHz and the mid-frequency range is between approximately 500 Hz to approximately 8 kHz. In another embodiment, the second all-pass frequency range is approximately 4 kHz to approximately 8 kHz. In other embodiments, different components values can be used, depending on the frequency response characteristics desired.

The summer 242 comprises the subtracting circuit 244 and the phase inverting circuit 246. The subtracting circuit 244 comprises resistors 385-389, and an amplifier 390. A first end of the resistor 386 receives the low frequency sum signal from the wiper terminal of the variable resistor 367. A first end of the resistor 387 receives the phase compensated mid-frequency sum signal from the output of the amplifier 385. A first end of the resistor 388 receives the high frequency sum signal from the wiper terminal of the variable resistor 375. An inverting input of the amplifier 390 connects to the second end of the resistor 386, a second end of the resistor 387, a second end of the resistor 388, and a first end of the resistor 389. A non-inverting input of the amplifier 390 connects to ground. An output of the amplifier 390 connects to a second end of the resistor 389 and to the phase inverting circuit 246.

In an embodiment, the resistors 387, 389 have a value of 100KΩ and the resistors 386, 388 have a value of 4 KΩ. The amplifier 390 is an operational amplifier, such as a low noise JEFT TL074A operational amplifier, or the like.

The phase inverting circuit 246 comprises resistors 391, 392, and an amplifier 393. A first end of the resistor 391 receives the negatively summed low frequency sum signal, the mid-frequency range sum signal, and the high frequency sum signal from the output of the amplifier 390. A second end of the resistor 391 connects to a first end of the resistor 392 and an inverting input of the amplifier 393. A non-inverting input of the amplifier 393 connects to ground. An output of the amplifier 393 connects to a second end of the resistor 392 and to the mixer 206 on FIG. 3C. In an embodiment, the resistors 391, 392, have a value of 10 KΩ, and the amplifier 393 is an operational amplifier, such as a low noise JFET TL074A operational amplifier, or the like.

Referring to FIG. 3C, the mixer 206 comprises the first combining circuit 248, the second combining circuit 250, and variable resistors 338, 394. The first combining circuit 248 receives the buffered left input signal, the difference information (L–R), the enhanced audio signals, and the phase compensated signal from FIG. 3A, and comprises resistors 339-346, a capacitor 347, and an amplifier 348.

A first end of the resistor 339 and a first end of the resistor 340 receive the buffered left input signal from the output of the amplifier 302 on FIG. 3A. A first end of the resistor 341 receives the phase compensated signal from the output of the amplifier 393 on FIG. 3B. A first end of the resistor 342 receives the difference information (L–R) from the output of the amplifier 318 on FIG. 3A. An inverting input of the amplifier 348 connects to a second end of the resistor 339, a second end of the resistor 340, a second end of the resistor 341, a second end of the resistor 342, and a first end of the resistor 345.

A non-inverting input of the amplifier 348 receives the enhanced difference signals and connects to a second end of the resistor 334 on FIG. 3A, a second end of the resistor 332, a second end of the resistor 333, and a first end of the resistor 343. A second end of the resistor 343 and a second end of the resistor 345 connect to ground. An output of the amplifier 348 connects to a second end of the resistor 344 and a first end of the resistor 346. A second end of the resistor 346 connects to a first end of the capacitor 347. A second end of the capacitor 347 connects to a second terminal of the variable resistor 338. A third terminal of the variable resistor 338 connects to ground. A second wiper terminal of the variable resistor 338 forms the left audio output signal $L_{OUT}$.

The second combining circuit 250 receives the buffered right input signal, the difference information (R–L), the enhanced audio signals, and the phase compensated signal from FIG. 3A, and comprises resistors 349-354, a capacitor 355, and an amplifier 356.

A first end of the resistor 349 and a first end of the resistor 351 receive the buffered right input signal from the output of the amplifier 314 on FIG. 3A. A first end of the resistor 350 receives the phase compensated signal from the output of the amplifier 393 on FIG. 3B. A first end of the resistor 352 on FIG. 3A receives the difference information (R–L) from the output of the amplifier 305. An inverting input of the amplifier 356 connects to a second end of the resistor 349, a second end of the resistor 350, a second end of the resistor 351, a second end of the resistor 352 on FIG. 3A, a first end of the resistor 353. The inverting input of the amplifier 356 receives the enhanced difference signals and also connects to a second end of the resistor 335 on FIG. 3A, a second end of the resistor 336 on FIG. 3A, and a second end of the resistor 337 on FIG. 3A.

A non-inverting input of the amplifier 356 connects to ground. An output of the amplifier 356 connects to a second end of the resistor 353 and a first end of the resistor 354. A second end of the resistor 354 connects to a first end of the capacitor 355. A second end of the capacitor 355 connects to a sixth terminal of the variable resistor 394. A fourth terminal of the variable resistor 394 connects to ground. A fifth wiper terminal of the variable resistor 394 forms the right audio output signal $R_{OUT}$.

The variable resistor 338 is ganged with a similar variable resistor 394 in the mixer 206. This is to ensure that any adjustments made to the left output signal $L_{OUT}$ or the right output signal $R_{OUT}$ will affect both signals. The variable resistor 338, 394 can be adjusted to vary the base amount of audio output signals $L_{OUT}$ and $R_{OUT}$ present at the output of the audio enhancement apparatus 200. In an embodiment, the variable resistor is a ganged pair of variable resistors. In an embodiment, the variable resistors are each 10 KΩ logarithmic track resistors, or the like.

In an embodiment, the audio output signals $L_{OUT}$ and $R_{OUT}$ can be played through loudspeakers. The left and right audio output signals $L_{OUT}$ and $R_{OUT}$ substantially correct the phase distortion generated by at least one loudspeaker when the left and right audio output signals are audibly reproduced by the at least one loudspeaker and perceived by a listener.

In another embodiment, the audio output signals $L_{OUT}$ and $R_{OUT}$ can be input into another audio enhancement apparatus for further audio enhancement or correction.

Although the embodiment of the audio enhancement system 200 depicted in FIG. 3 is illustrated as a circuit schematic, the audio enhancement system 200 can be implemented as software, as software representing instructions to a digital signal processor, as hardware, or as a combination of hardware and software.

Figure 4:
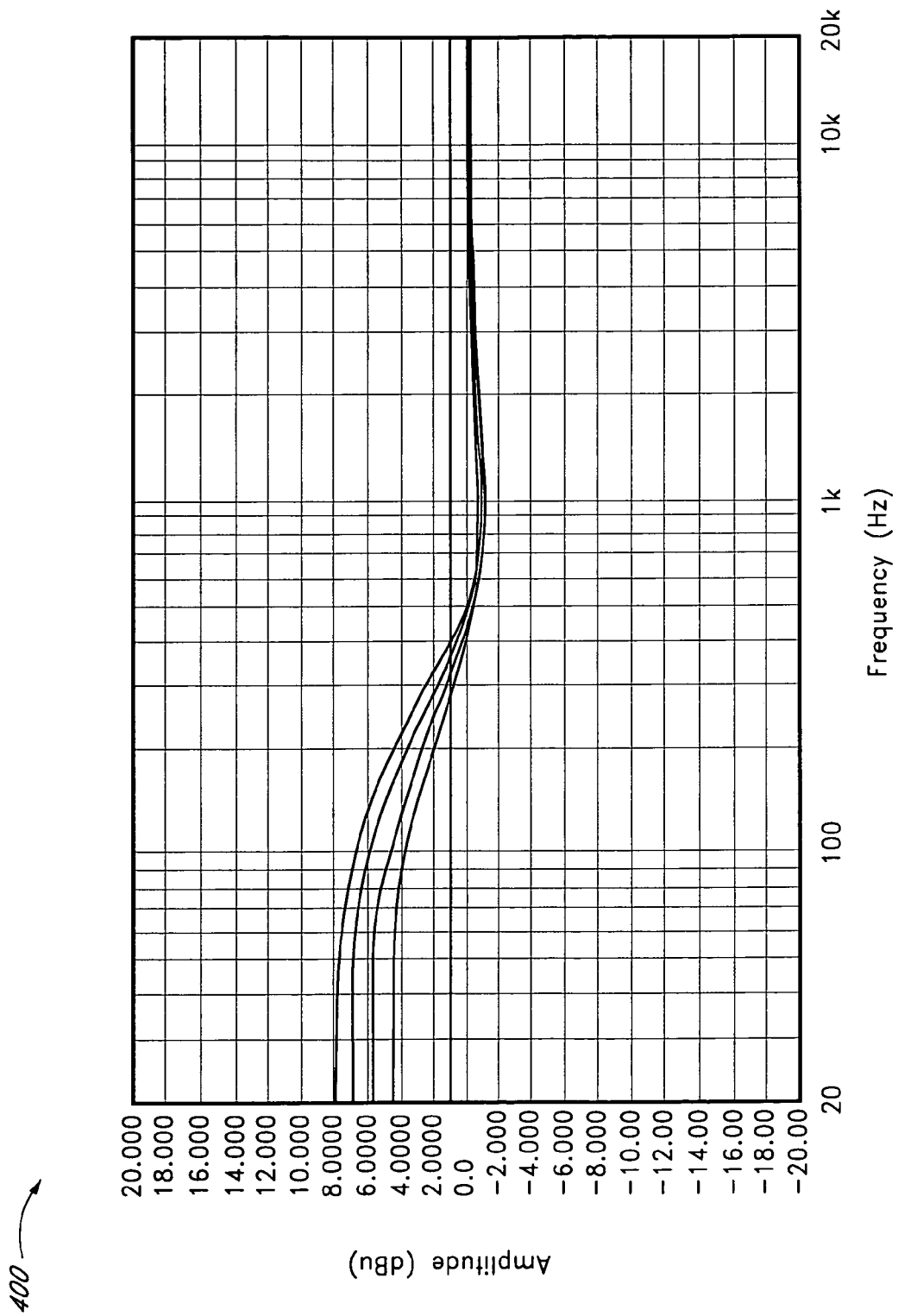
FIG. 4 is a graphical representation of the various levels of signal modification provided by an embodiment of a low-pass shelving filter.

FIG. 4 is a graphical representation 400 of the various levels of signal modification provided by an embodiment of the low-pass shelving filter 236 of FIG. 2. The x-axis indicates frequency in Hertz and the y-axis indicates amplitude in dBu. Possible levels of low-pass filtering provided by the low-pass shelving filter 236 are depicted by various curves having different amplitude verses frequency characteristics. Many of the illustrated curves have a pass band from approximately 20 Hz to approximately 100 Hz, a transition band from approximately 100 Hz to approximately 500 Hz, and a stop band from approximately 500 Hz to approximately 20 kHz. The amplitude of the various frequency responses in the pass-band ranges from approximately 4 dBu to approximately 8 dBu. In an embodiment, varying the value of the variable resistor 367 in FIG. 3 varies the amplitude of the filter response as illustrated in FIG. 4.

Figure 5:
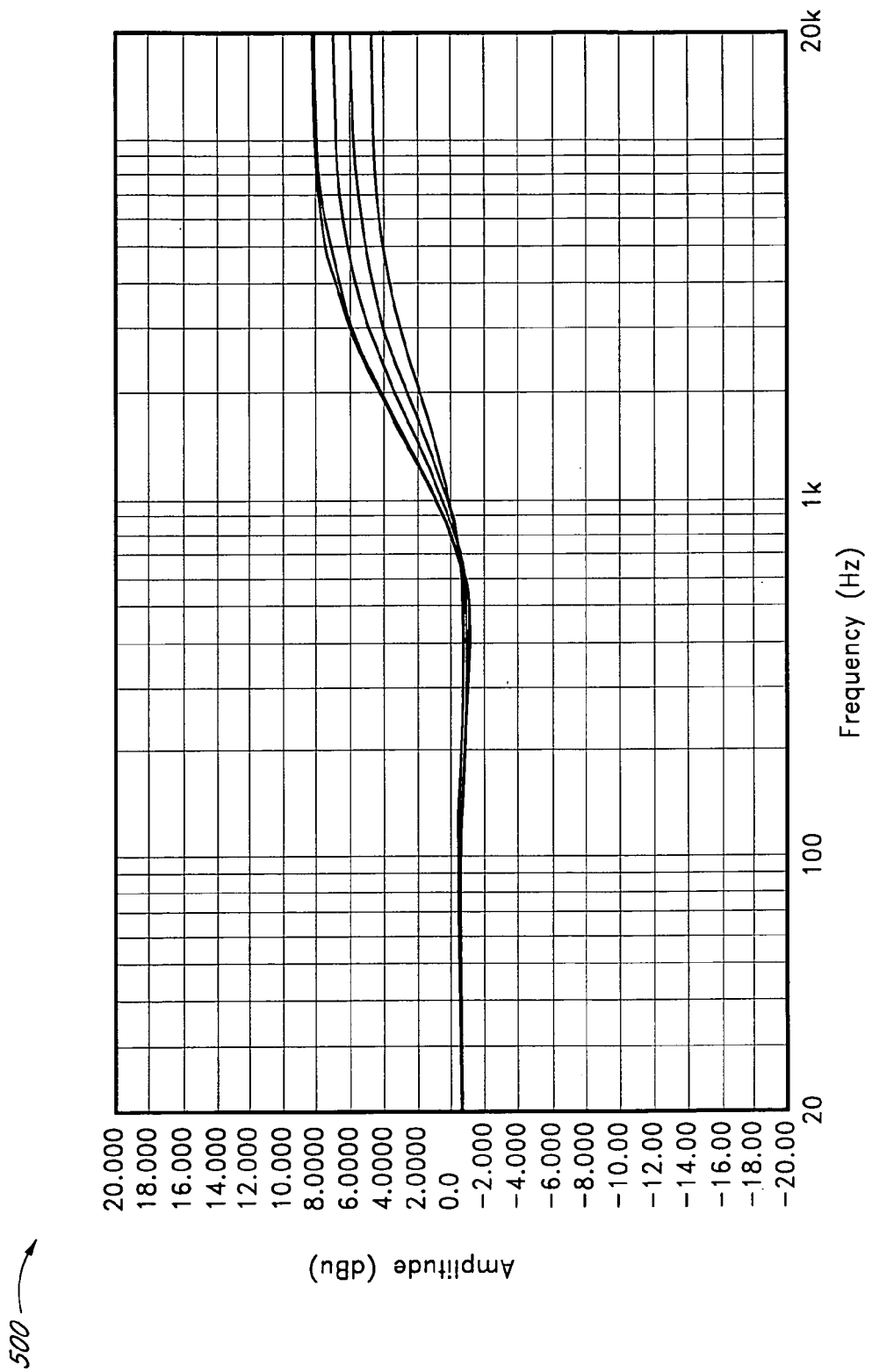
FIG. 5 is a graphical representation of the various levels of signal modification provided by an embodiment of a high-pass shelving filter.

FIG. 5 is a graphical representation 500 of the various levels of signal modification provided by an embodiment of the high-pass shelving filter 238 of FIG. 2. The x-axis indicates frequency in Hertz and the y-axis indicates amplitude in dBu. Possible levels of high-pass filtering provided by the high-pass shelving filter 238 are depicted by various curves having different amplitude verses frequency characteristics. Many of the illustrated curves have a pass band from approximately 5 kHz to approximately 20 kHz, a transition band from approximately 500 Hz to approximately 5 kHz, and a stop band from approximately 20 Hz to approximately 500 Hz. The amplitude of the various frequency responses in the pass-band ranges from approximately 4 dBu to approximately 8 dBu. In an embodiment, varying the value of the variable resistor 375 in FIG. 3 varies amplitude of the filter response as illustrated in FIG. 5.

Figure 6:
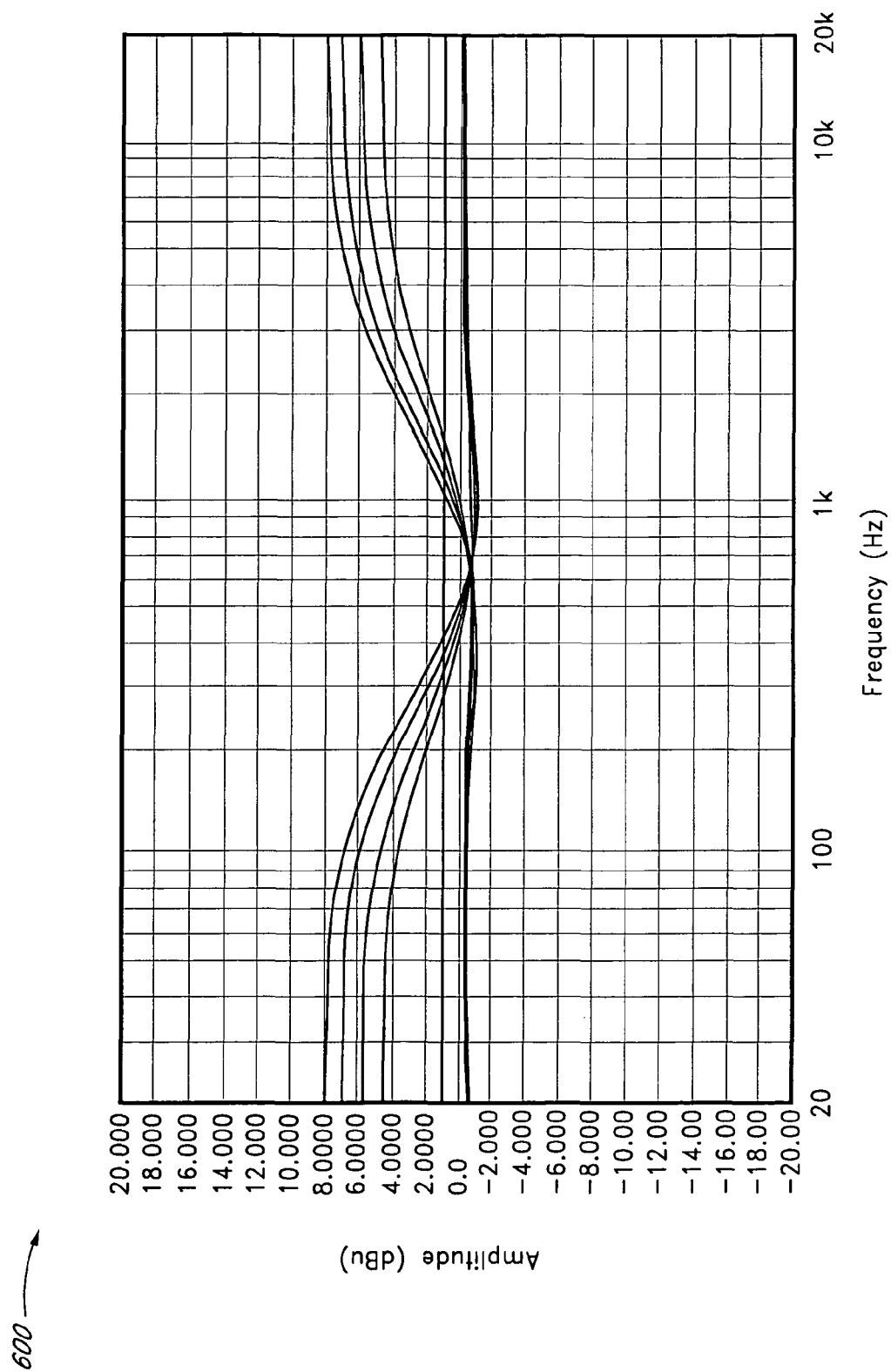
FIG. 6 is a graphical representation depicting the possible ranges of signal modification provided an embodiment of the low-pass shelving filter of FIG. 4 and an embodiment of the high-pass shelving filter of FIG. 5.

FIG. 6 is a graphical representation 600 depicting the possible ranges of signal modification provided an embodiment of the low-pass shelving filter of FIG. 4 and an embodiment of the high-pass shelving filter of FIG. 5. The x-axis indicates frequency in Hertz and the y-axis indicates amplitude in dBu. The various filter response curves represented in FIG. 6 illustrate the varying amounts of filtering that can be created by adjusting the filter parameters for the low-pass filter 236 and the high-pass filter 238. In an embodiment, an infinite number of filter response curves are possible through independent adjustment of the low-pass and high-pass shelving filter parameters.

Figure 7:
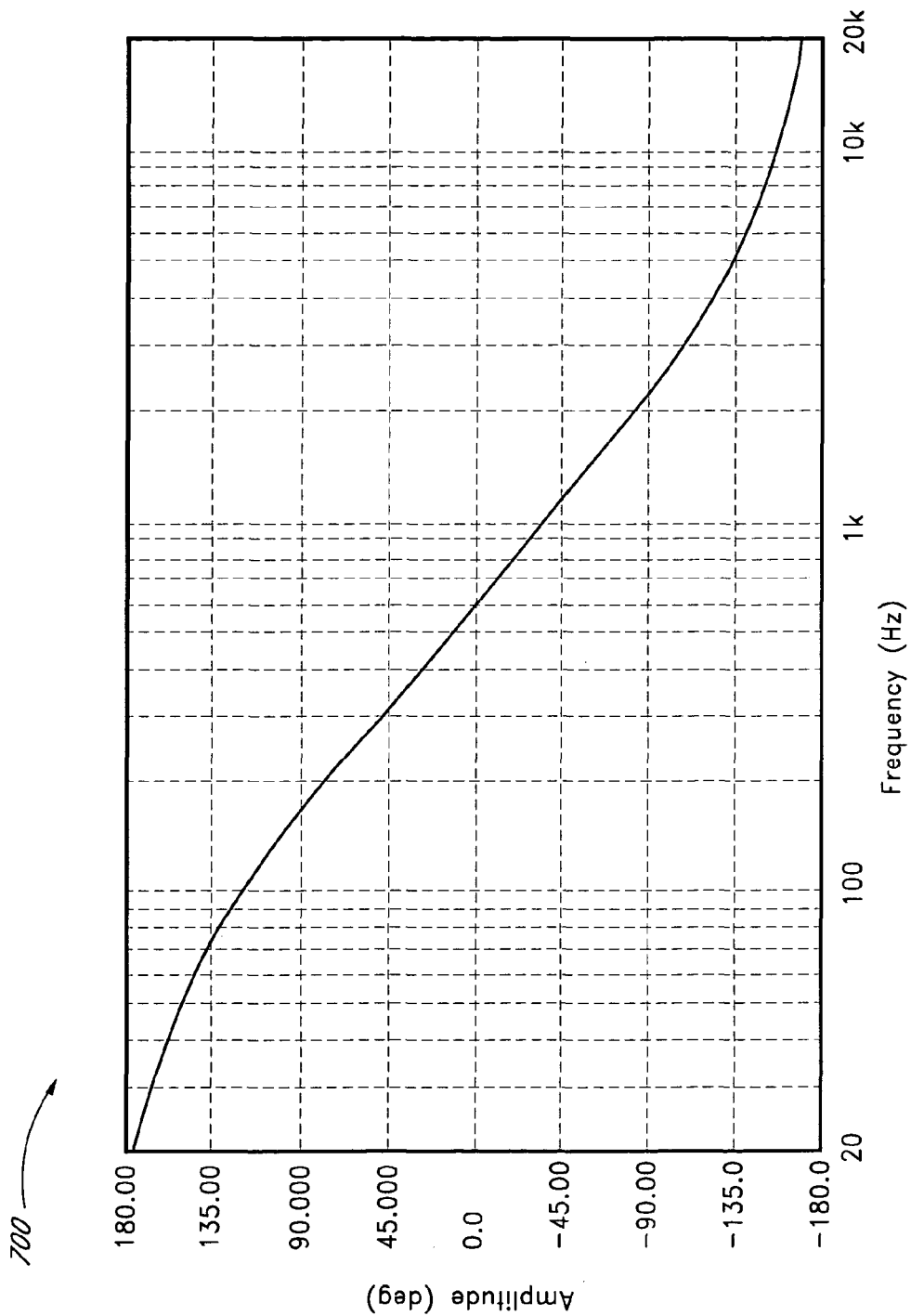
FIG. 7 is a graphical representation of phase versus frequency characteristic of an embodiment of an all-pass filter.

FIG. 7 is a graphical representation 700 of a phase versus frequency characteristic of an embodiment of the all-pass filter 240 of FIG. 2. The x-axis indicates frequency in Hertz and the y-axis indicates phase in degrees. The curve illustrated in FIG. 7 has a phase response of approximately 180° at approximately 20 Hz and a first corner frequency of approximately 700 Hz with a phase of approximately 135°. The response is approximately linear from approximately 700 Hz to approximately 5 kHz with approximately no phase shift (phase=0°) at approximately 600 Hz. The curve has a second corner frequency at approximately 5 kHz with a phase response of approximately −135°.

Figure 8:
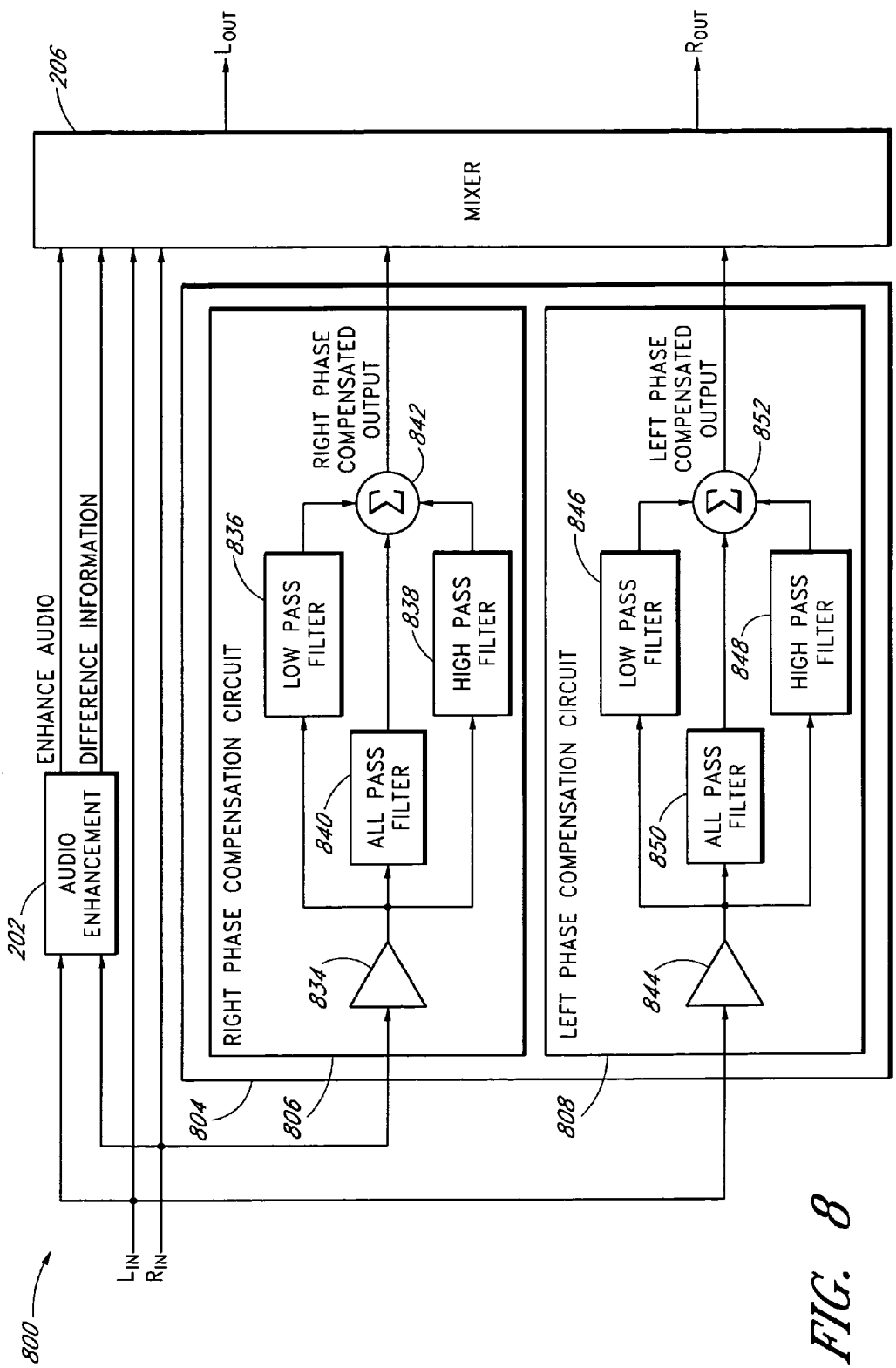
FIG. 8 is a schematic illustrating another embodiment of an audio enhancement system comprising phase compensation.

FIG. 8 illustrates an embodiment of an audio enhancement apparatus 800 comprising the audio enhancement circuit 202, a phase compensation circuit 804, and the mixer 206. The audio enhancement circuit 204 receives the left audio input signal $L_{IN}$ and the right audio input signal $R_{IN}$ and produces the enhanced audio signals and the difference information (R−L), (L−R) as described above with respect to FIG. 2.

The phase compensation circuit 804 receives the left audio input signal $L_{IN}$ and the right audio input signal $R_{IN}$ and processes the input signals, $L_{IN}$, $R_{IN}$ to produce a left phase compensated output signal and a right phase compensated output signal. In an embodiment, the phase compensation circuit 804 comprises a right phase compensation circuit 806 and a left phase compensation circuit 808.

The right phase compensation circuit 806 comprises a buffer 834, a low-pass filter 836, and a high-pass filter 838. The buffer 834 receives the right audio input signal $R_{IN}$ and buffers the right input signal $R_{IN}$ to produce a buffered right signal.

The low-pass filter 836 receives the buffered right signal. The low-pass filter 836 filters the buffered right signal to produce a filtered low-frequency right signal in the first frequency range. In an embodiment, the low-pass filter is the low-pass shelving filter 236 and can have a variety of frequency responses as indicated in FIG. 4, depending on the specific filter parameters. In an embodiment, the first frequency range is approximately 20 Hz to approximately 500 Hz.

The high-pass filter 838 also receives the buffered right signal. The high-pass filter 838 filters the buffered right signal to produce a filtered high frequency right signal in the second frequency range. In an embodiment, the high-pass filter is the high-pass shelving filter 238 and can have a variety of frequency responses as indicated in FIG. 5, depending on the specific filter parameters. In an embodiment, the second frequency range is approximately 8 kHz to approximately 20 kHz.

The right phase compensation circuit 806 further comprises an all-pass filter 840. In an embodiment, the all-pass filter 840 comprises two all-pass filters connected in series. In another embodiment, the all-pass filter 840 comprises three all-pass filters connected in series. The all-pass filter 840 receives the buffered right signal and phase shifts the buffered right signal in the third frequency range to produce a phase compensated mid-frequency range right signal. In an embodiment, the third frequency range is approximately 500 Hz to approximately 8 kHz. In another embodiment, the third frequency range is approximately 300 Hz to approximately 20 kHz.

The right phase compensation circuit 806 further comprises a combining circuit 842. The combining circuit 842 receives the filtered low frequency right signal from the low-pass filter 836, the high frequency right signal from the high-pass filter 838, and the frequency compensated mid-frequency range right signal from the all-pass filter 840. The combining circuit 842 combines the filtered low frequency right signal, the filtered high frequency right signal, and the phase compensated mid-range right signal to produce a phase compensated right signal.

The left phase compensation circuit 806 comprises a buffer 844, a low-pass filter 846, and a high-pass filter 848. The buffer 844 receives the left audio input signal $L_{IN}$ and buffers the left audio input signal $L_{IN}$ to produce a buffered left signal.

The low-pass filter 846 receives the buffered left signal. The low-pass filter 846 filters the buffered left signal to produce a filtered low-frequency left signal in the first frequency range. In an embodiment, the low-pass filter 846 is the low-pass shelving filter 236 and can have a variety of frequency responses as indicated in FIG. 4, depending on the specific filter parameters. In an embodiment, the first frequency range is approximately 20 Hz to approximately 500 Hz.

The high-pass filter 848 also receives the buffered left signal. The high-pass filter 848 filters the buffered left signal to produce a filtered high frequency left signal in the second frequency range. In an embodiment, the high-pass filter is the high-pass shelving filter 238 and can have a variety of frequency responses as indicated in FIG. 5, depending on the specific filter parameters. In an embodiment, the second frequency range is approximately 8 kHz to approximately 20 kHz.

The left phase compensation circuit 806 further comprises an all-pass filter 850. In an embodiment, the all-pass filter 850 comprises two all-pass filters connected in series. In another embodiment, the all-pass filter comprises three all-pass filters connected in series. The all-pass filter 840 receives the buffered left signal and phase shifts the buffered left signal in the third frequency range to produce a phase compensated mid-frequency range left signal. In an embodiment, the third frequency range is approximately 500 Hz to approximately 8 kHz. In another embodiment, the third frequency range is approximately 300 Hz to approximately 20 kHz.

The left phase compensation circuit 806 further comprises a combining circuit 852. The combining circuit 852 receives the filtered low frequency left signal from the low-pass filter 846, the high frequency left signal from the high-pass filter 848, and the frequency compensated mid-frequency range left signal from the all-pass filter 850. The combining circuit 852 combines the filtered low frequency left signal, the filtered high frequency left signal, and the phase compensated mid-range left signal to produce a phase compensated left signal.

The mixer 806 receives the enhanced audio signals, the difference information (R−L), (L−R), the phase compensated right signal, the phase compensated left signal, the left audio input signal $L_{IN}$ and the right audio input signal $R_{IN}$. In an embodiment, the mixer 806 comprises the first combining circuit 248 and the second combining circuit 250.

The first combining circuit 248 receives the enhanced audio signals, the difference information (L−R), the phase compensated left and right signals, and the left audio input signal $L_{IN}$ and combines the signals to produce the left output signal $L_{OUT}$. In an embodiment, the first combining circuit 248 subtracts the enhanced audio signals and adds the difference information (L−R), the phase compensated left and right signals, and the left audio input $L_{IN}$ to produce the left output signal $L_{OUT}$.

The second combining circuit 250 receives the enhanced audio signals, the difference information (R−L), the phase compensated left and right signals, and the right audio input signal $R_{IN}$ and combines the signals to produce the right output signal $R_{OUT}$. In an embodiment, the second combining circuit 250 adds the enhanced audio signals, the difference information (R−L), the phase compensated left and right signals, and the right audio input signal $R_{IN}$ to produce the right output signal $R_{OUT}$.

In an embodiment, the mixer 806 further comprises the optional level adjust 252 to adjust the base level of the output signals $L_{OUT}$ and $R_{OUT}$ to the user's personal preference. In an embodiment, the audio output signals $L_{OUT}$ and $R_{OUT}$ can be played through loudspeakers. The left and right audio output signals $L_{OUT}$ and $R_{OUT}$ substantially correct the phase distortion generated by at least one loudspeaker when the left and right audio output signals $L_{OUT}$ and $R_{OUT}$ are audibly reproduced by the at least one loudspeaker and perceived by a listener.

In another embodiment, the audio output signals $L_{OUT}$ and $R_{OUT}$ can be input into another audio enhancement apparatus for further audio enhancement or correction.

Figure 9A:
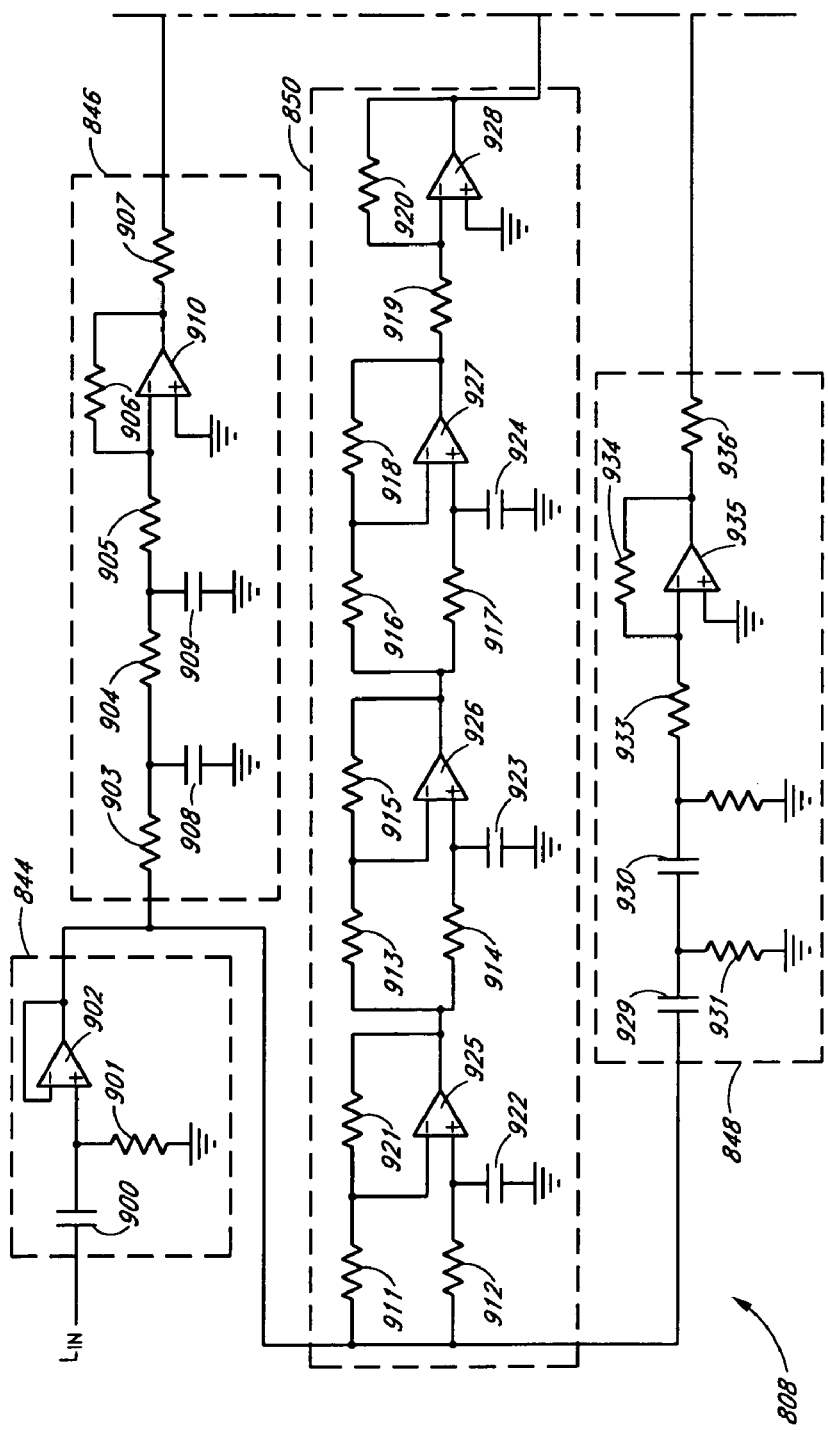
Figure 9B:
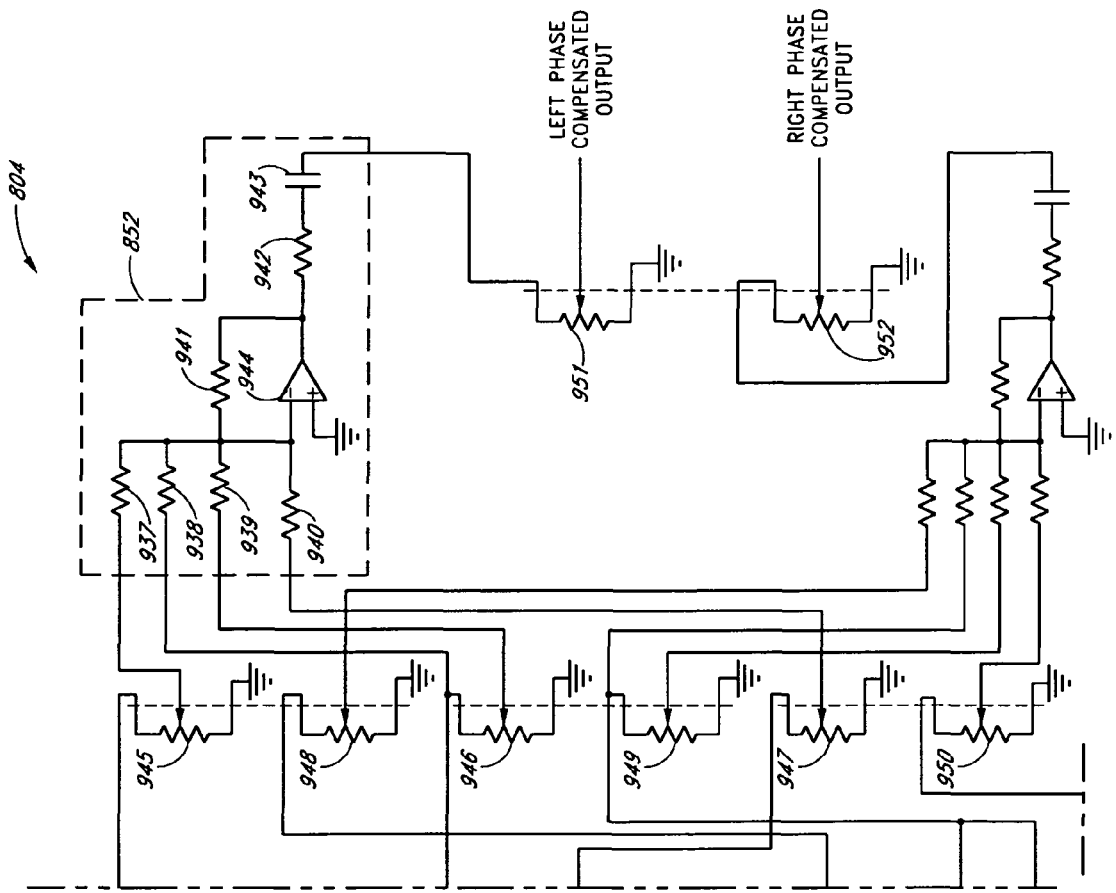
Figure 9C:
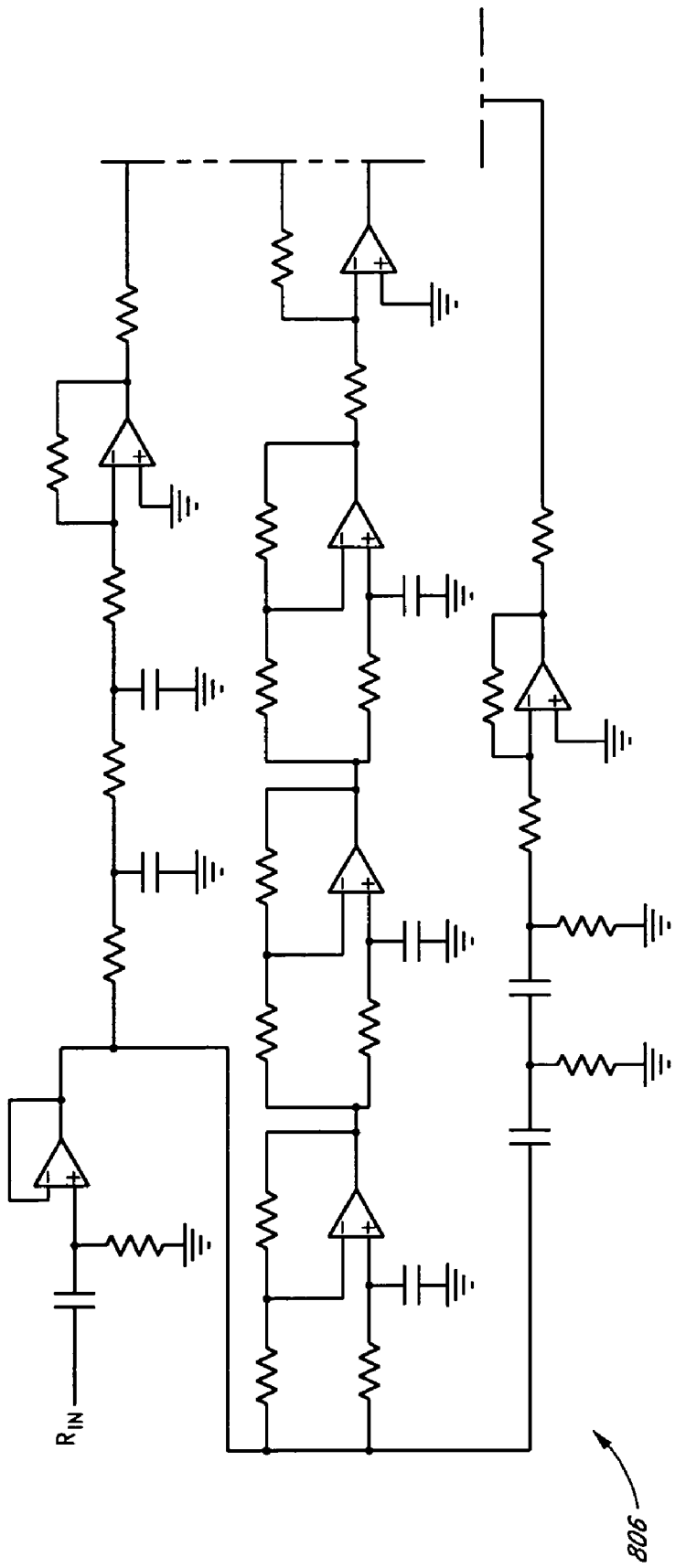

FIGS. 9, 9A, 9B, 9C are a schematic diagram of an embodiment of the phase compensation system 804 comprising the right phase compensation circuit 806, the left phase compensation circuit 808, and variable resistors 945-948. Referring to FIG. 9A, the left phase compensation circuit 808 processes the left audio input signal $L_{IN}$ through the left low-pass filter 846, the left all-pass filter 850, the left high-pass filter 848, and the combining circuit 852 combines the filter outputs to create the left phase compensated output signal, as indicated in FIG. 8. Referring to FIGS. 8 and 9C, the right phase compensation circuit 806 processes the right audio input signal $R_{IN}$ through the right low-pass filter 836, the right all-pass filter 840, the right high-pass filter 838, and the combining circuit 842 combines the filter outputs to create the right phase compensated output signal, as indicated in FIG. 8.

The left and right phase compensation circuits 808, 806, in the embodiment illustrated in FIGS. 9A, 9C, are intended to perform the same signal conditioning to their respective input signals, $L_{IN}$, $R_{IN}$. Accordingly, the specifications for the left phase compensation circuit 808 are substantially identical to those of the right phase compensation circuit 806. For the purposes of simplicity, only the circuit connections and functional operations of the left phase compensation circuit 808 will be explained.

Referring to FIG. 9A, the left buffer 844 receives the left audio input signal $L_{IN}$ and comprises a capacitor 900, a resistor 901, and an amplifier 903. The left audio input signal $L_{IN}$ inputs to a first end of the capacitor 900. A second end of the capacitor 900 connects to a first end of the resistor 901 and a non-inverting input of the amplifier 902. An output of the amplifier 902 connects to an inverting input of the amplifier 902 and to the low-pass filer 836. A second end of the resistor 901 connects to ground. In an embodiment, the capacitor 900 has a value of 4.7 µFD, the resistor 901 has a value of 100 KΩ. In an embodiment, the amplifier 390 is an operational amplifier, such as for example, a TL074A low noise JFET operational amplifier, or the like.

The low-pass filter 846 receives the buffered left input signal and comprises resistors 903-907, capacitors 908, 909, and an amplifier 910. A first end of the resistor 903 receives the buffered left input signal from the output of the amplifier 902. A second end of the resistor 903 connects to a first end of the resistor 904 and a first end of the capacitor 908. A second end of the resistor 904 connects to a first end of the resistor 905 and a first end of the capacitor 909. A second end of the capacitor 908 and a second end of the capacitor 909 connect to ground. A second end of the resistor 905 connects to a first end of the resistor 906 and an inverting input of the amplifier 910. A non-inverting input of the amplifier 910 connects to ground. An output of the amplifier 910 connects to a second end of the resistor 906 and a first end of the resistor 907.

Referring to FIGS. 9A, 9B, a second end of the resistor 907 connects to a first terminal of the variable resistor 945. A third terminal of the variable resistor 945 connects to ground. The variable resistor 948 is ganged with a similar variable resistor 950 in the right phase compensation circuit 806 on FIG. 9C. This is ensure that any adjustments made to the left phase compensation circuit 808, or the right phase compensation circuit 806, will affect both circuits 806, 808. The variable resistor 945, 948 can be adjusted to vary the base amount of the low frequency signal from the low-pass filter 846, 836 present in the left and right phase compensated output signals, respectively. In an embodiment, the variable resistors 945, 948 are each 1 KΩ linear track resistors.

In an embodiment, the resistors 903, 904 each have a value of 10 KΩ. The capacitors 908, 909 each have a value of 0.039 µFD. The resistor 905 has a value of 49.9 KΩ, the resistor 906 has a value of 332 KΩ, and the resistor 907 has a value of 316Ω. In an embodiment, the amplifier 910 is an operational amplifier, such as for example, a TL074A low noise JFET operational amplifier, or the like.

In an embodiment, the low-pass filters 836, 846 are an embodiment of the low-pass shelving filter 236. Possible levels of low-pass filtering provided by the low-pass shelving filter 236 are depicted by various curves having different amplitude verses frequency characteristics, as illustrated in FIG. 4.

Referring to FIG. 9A, the all-pass filter 850 receives the buffered left input signal from the output of the amplifier 902. In the embodiment illustrated in FIG. 9A, the all-pass filter 850 comprises three all-pass filters connected in series. The first all-pass filter comprises resistors 911, 912, 921, a capacitor 922, and an amplifier 923. The second all-pass filter comprises resistors 913-915, a capacitor 923, and an amplifier

926. The third all-pass filter comprises resistors 916-919, a capacitor 924, and an amplifier 927. The all-pass filter 850 further comprises a buffer circuit comprising a resistor 920 and an amplifier 928.

A first end of the resistor 911 and a first end of the resistor 912 receive the buffered left input signal from the output of the amplifier 902. A second end of the resistor 911 connects to the inverting input of the amplifier 925 and to a first end of the resistor 921. A second end of the resistor 912 connects to a first end of the capacitor 922 and to a non-inverting input of the amplifier 925. The second end of the capacitor 922 connects to ground. An output of the amplifier 925 connects to a second end of the resistor 921, a first end of the resistor 913, and a first end of the resistor 914.

A second end of the resistor 913 connects to an inverting input of the amplifier 926 and to a first end of the resistor 915. A second end of the resistor 914 connects to a non-inverting input of the amplifier 926 and a first end of the capacitor 923. A second end of the capacitor 923 connects to ground. An output of the amplifier 926 connects to a second end of the resistor 915, a first end of the resistor 916, and a first end of the resistor 917.

A second end of the resistor 917 connects to a first end of the capacitor 924 and a non-inverting input of the amplifier 927. A second end of the capacitor 924 connects to ground. An output of the amplifier 927 connects to a second end of the resistor 918 and to a first end of the resistor 919.

A second end of the resistor 919 connects to an inverting input of the amplifier 928, and a first end of a resistor 920. A non-inverting input of the amplifier 928 connects to ground.

Referring to FIGS. 9A, 9B, an output of the amplifier 928 connects to a second end of the resistor 920 and to a first terminal of the variable resistor 946 on FIG. 9B. A third terminal of the variable resistor 946 connects to ground. The variable resistor 946 is ganged with a similar variable resistor 949 in the right phase compensation circuit 806 on FIG. 9C. This is ensure that any adjustments made to the left phase compensation circuit 808, or vice versa, will affect both circuits 806, 808. The variable resistor 946, 949 can be adjusted to vary the base amount of the phase compensated voice frequency signal from the all-pass filter 850, 840 present in the left and right phase compensated output signals, respectively. In an embodiment, the variable resistors 946, 949 are each 1 KΩ linear track resistors.

In an embodiment, the resistors 911, 921, 913, 915, 916, 918 each have a value of 100 KΩ. The resistor 912 has a value of 30.1 KΩ, the resistor 914 has a value of 18.2 KΩ, and the resistor 919 has a value of 3.32 KΩ. The resistors 917, 920 each have a value of 10 KΩ. The capacitors 922, 923, 924 have values of 0.01 μFD, 0.015 μFD, and 0.0022 μFD, respectively. In an embodiment, the amplifiers 925-928 are operational amplifiers, such as, for example, low noise JFET TL074A operational amplifiers, or the like.

In an embodiment, the left all-pass filter 850 shifts the phase of the left audio input signal $L_{IN}$ from approximately 50 Hz to approximately 20 kHz. In the embodiment illustrated in FIG. 9, the component values are chosen such that the first all-pass filter of the left all-pass filter 850 has a corner or start frequency of approximately 50 Hz and a frequency range of approximately 50 Hz to approximately 500 Hz. Further, the component values are chosen such that the second all-pass filter of the left all-pass filter 850 has a corner or start frequency of approximately 600 Hz and a frequency range of approximately 600 Hz to approximately 6 kHz.

In an embodiment, the left phase compensation circuit 808 further comprises a first cutoff filter, which filters the output of the second all-pass filter of the left all-pass filter 850 to cut off the phase-shifted signal at approximately 5 kHz.

Further, the component values are chosen such that the third all-pass filter of the left all-pass filter 850 has a corner or start frequency of approximately 4.85 kHz and a frequency range of approximately 4.85 kHz to 48.5 kHz.

In an embodiment, the left phase compensation circuit 808 further comprises a second cutoff filter, which filters the output of the third all-pass filter of the left all-pass filter 850 to cut off the phase-shifted signal at approximately 20 kHz.

Referring to FIG. 9A, the high-pass filter 848 receives the buffered left input signal and comprises resistors 931-934, 936, capacitors 929, 930, and an amplifier 935. A first end of the capacitor 929 receives the buffered left input signal from the output of the amplifier 902. A second end of the capacitor 929 connects to a first end of the resistor 931 and a first end of the capacitor 930. A second end of the capacitor 930 connects to a first end of the resistor 932 and a first end of the resistor 933. A second end of the resistor 931 and a second end of the resistor 932 connect to ground. A second end of the resistor 933 connects to an inverting input of the amplifier 930 and a first end of the resistor 934. A non-inverting input of the amplifier 935 connects to ground. An output of the amplifier 935 connects to a second end of the resistor 934 and a first end of the resistor 936.

Referring to FIGS. 9A, 9B, a second end of the resistor 936 connects to a first terminal of the variable resistor 947 and a third terminal of the variable resistor 947 connects to ground. The variable resistor 947 is ganged with a similar variable resistor 950 in the right phase compensation circuit 806 on FIG. 9C. This is ensure that any adjustments made to the left phase compensation circuit 808 or the right phase compensation circuit 806 will affect both circuits 806, 808. The variable resistor 947, 950 can be adjusted to vary the base amount of the high frequency signal from the high-pass filter 848, 838 present in the left and right phase compensated output signals, respectively. In an embodiment, the variable resistors 947, 950 are each 1 KΩ linear track resistors.

In an embodiment, the capacitors 929, 930 each have a value of 0.015 μFD. The resistors 931, 932 each have a value of 10 KΩ. The resistors 933, 934, 936 have values of 49.9 KΩ, 274 KΩ, and 511Ω, respectively. In an embodiment, the amplifier 985 is an operational amplifier, such as for example, a low noise JFET TL074A operational amplifier, or the like.

In an embodiment, the high-pass filters 838, 848 are an embodiment of the high-pass shelving filter 238. Possible levels of high-pass filtering provided by the high-pass shelving filter 238 are depicted by various curves having different amplitude verses frequency characteristics, as illustrated in FIG. 5.

Referring to FIG. 9B, the left summing circuit 852 comprises resistors 937-941, a capacitor 943, and an amplifier 944, and receives the high frequency signal, the phase compensated voice frequency signal, and the low frequency signal from the high-pass filter 848, the all-pass filter 850, and the low-pass filter 846, respectively.

A first end of the resistor 937 receives an adjustable high frequency signal from a wiper terminal of the variable resistor 945. A first end of the resistor 938 receives the phase compensated voice signal from the output of the amplifier 928. A first end of the resistor 939 receives an adjustable phase compensated voice frequency signal from a wiper terminal of the variable resistor 946. A first terminal of the resistor 940 receives an adjustable low frequency signal from a wiper terminal of the variable resistor 947. An inverting input of the amplifier 944 connects to a second end of the resistor 937, a second end of the resistor 938, a second end of the resistor 939, a second end of the resistor 940, and a first end of the resistor 941. A non-inverting input of the amplifier 944 connects to ground.

An output of the amplifier 944 connects to a first end of the resistor 942 and a second end of the resistor 942 connects to a first end of the capacitor 943. The second end of the capacitor 943 connects to a first terminal of a variable resistor 951 and a third terminal of the variable resistor 951 connects to ground. A wiper terminal of the variable resistor 951 connects to the left phase compensated output signal.

In the embodiment illustrated in FIG. 9, resistors 937, 939, 940, 941 each have the value of 10 KΩ. The resistors 938, 942 have the values 29.4 KΩ, and 200Ω, respectively. In an embodiment, the amplifier 944 is an operational amplifier, such as for example, a TL074A low noise JFET operational amplifier, or the like.

The variable resistor 951 is ganged with a similar variable resistor 952 in the right phase compensation circuit 806. This is ensure that any adjustments made to the left phase compensation circuit 808 or the right phase compensation circuit 806 will affect both circuits 806, 808. The variable resistor 951, 952 can be adjusted to vary the base amount of the left and right phase compensated mid-frequency range signal present in the left and right phase compensated output signals, respectively. In an embodiment, the variable resistors 951, 952 are each 10 KΩ logarithmic track resistors.

Different loudspeakers exhibit different phase distortion characteristics due to differences in speaker construction and size. Variable resistors 945-948, 946-949, 947-950 permit independent adjustment, according to the user's preference and the loudspeaker characteristics, of the low frequency signal, mid-frequency range signal, and high frequency signal amounts, respectively, present in the phase compensated left and right output signals such that the phase compensated left and right signals substantially correct the phase distortion generated by at least one loudspeaker when the phase compensated left and right signals are audibly reproduced by the at least one loudspeaker and perceived by a listener. This permits phase correction for a variety of speaker types, constructions, and configurations.

Although the embodiment of the phase compensation circuit 804 depicted in FIG. 9 is illustrated as a circuit schematic, the phase compensation circuit 804 can be implemented as software, as software representing instructions to a digital signal processor, as hardware, or as a combination of hardware and software. In addition, in other embodiments, different component values or filter implementations can be used depending on the desired filter characteristics.

Figure 10:
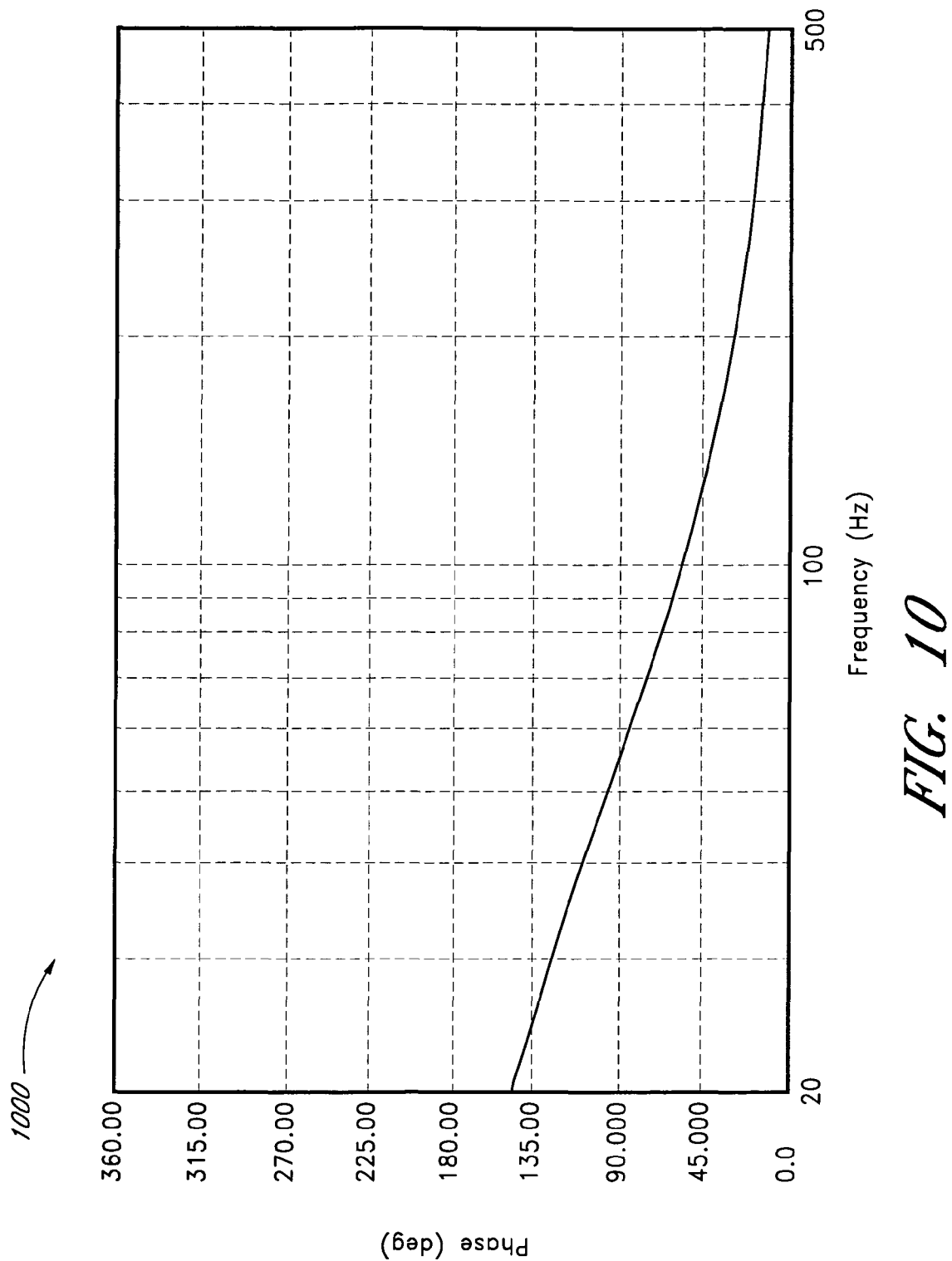
FIG. 10 is a graphical representation of a phase versus frequency characteristic of an embodiment of an all-pass filter.

In an embodiment, the all-pass filter 840, 850 comprises the first, the second, and the third all-pass filter connected in series, as illustrated in FIG. 9. FIG. 10 is a graphical representation 1000 of phase versus frequency characteristic of an embodiment of the first all-pass filter of the filters 840, 850. The x-axis indicates frequency in Hertz and the y-axis indicates phase in degrees. The curve of FIG. 10 has a phase response of approximately 145° at approximately 20 Hz and a first corner frequency at approximately 50 Hz with a phase of approximately 85°. The response is approximately linear from approximately 50 Hz to approximately 140 Hz with a phase shift of approximately 45° at approximately 140 Hz. The curve has a second corner frequency at approximately 140 Hz and a phase response of approximately 10° at approximately 500 Hz.

Figure 11:
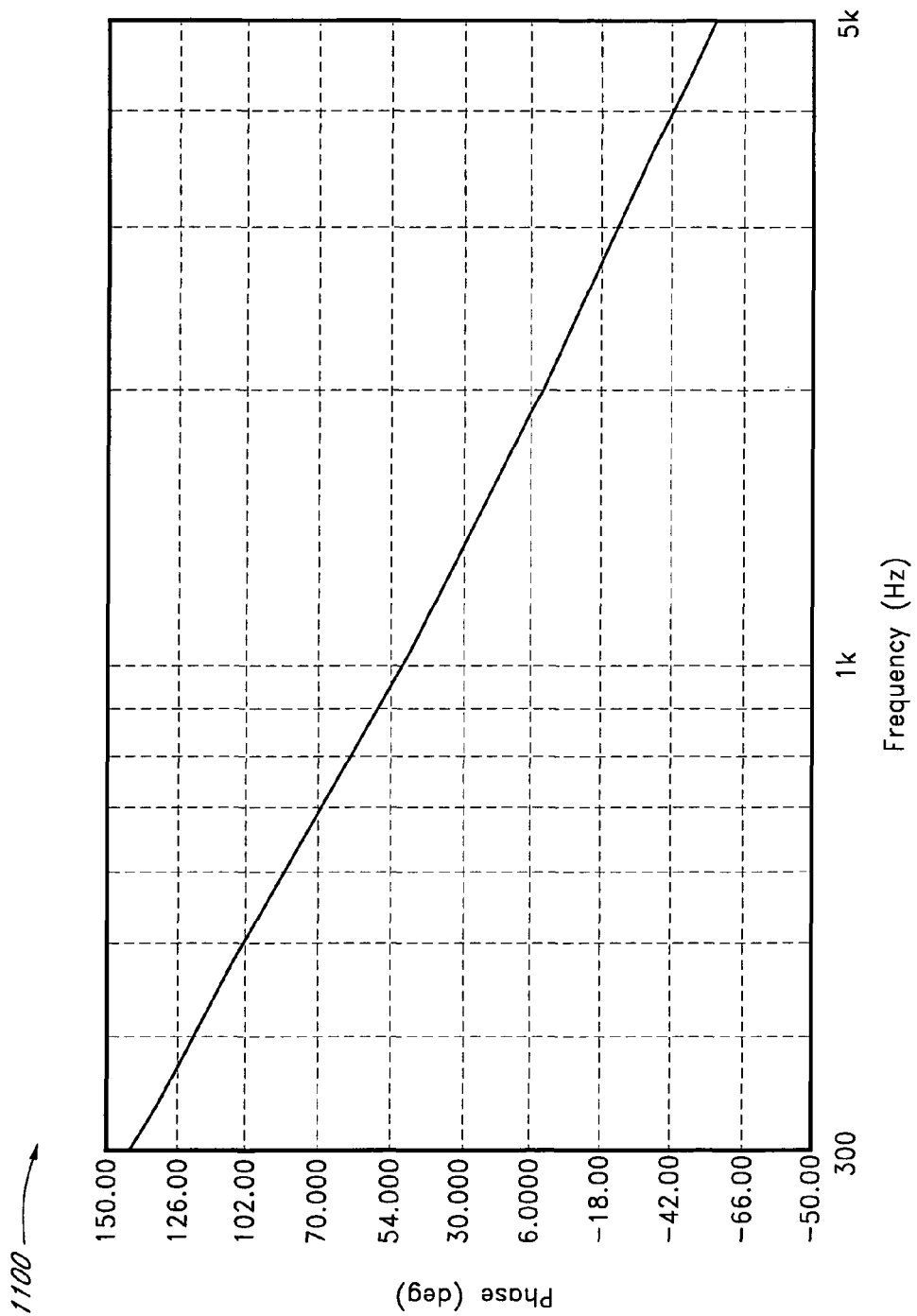
FIG. 11 is a graphical representation of phase versus frequency characteristic of an embodiment of an all-pass filter.

FIG. 11 is a graphical representation 1100 of phase versus frequency characteristic of an embodiment of the second all-pass filter of the filters 840, 850. The x-axis indicates frequency in Hertz and the y-axis indicates phase in degrees. The curve of FIG. 11 has a phase response of approximately 140° at approximately 300 Hz and is approximately linear with a phase response of approximately −50° at approximately 5 kHz. The phase shift is approximately zero (phase=0°) at approximately 2 kHz.

Figure 12:
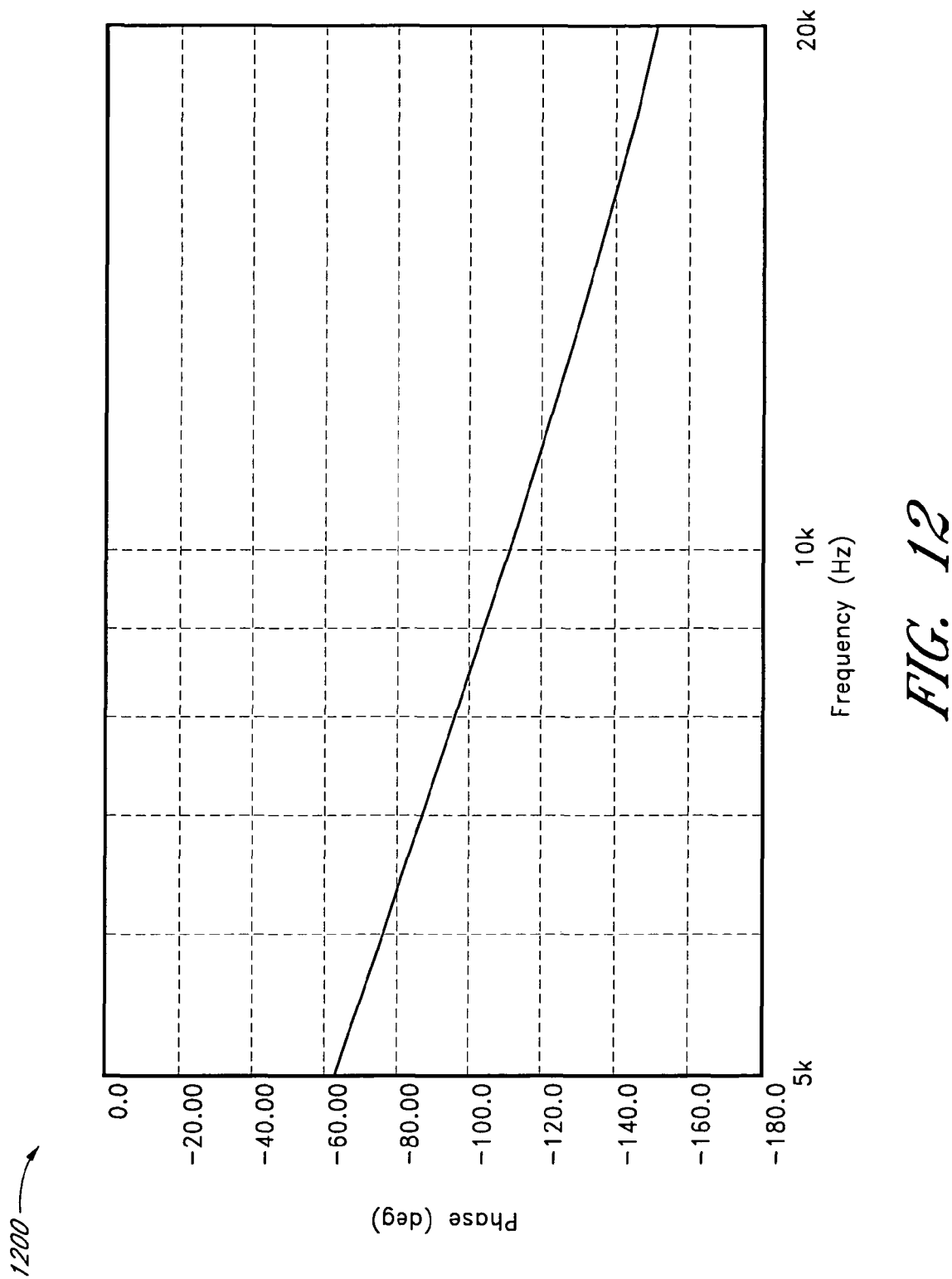
FIG. 12 is a graphical representation of phase versus frequency characteristic of an embodiment of an all-pass filter.

FIG. 12 is a graphical representation 1200 of phase versus frequency characteristic of an embodiment of the third all-pass filter of the filters 840, 850. The x-axis indicates frequency in Hertz and the y-axis indicates phase in degrees. The curve of FIG. 12 has a phase response of approximately −60° at approximately 5 kHz and is approximately linear with a phase response of approximately −145° at approximately 20 kHz.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions.

What is claimed is:

1. A phase compensation system for substantially correcting phase distortion of sound reproduced by at least one loudspeaker, the system comprising:
   a first combiner configured to receive left and right audio input signals and to combine the left and right audio input signals to form a combined audio input;
   a second combiner configured to receive the left and right audio input signals and to combine the left and right audio input signals to obtain difference information;
   an audio enhancer configured to enhance the difference information by at least modifying a frequency range of the difference information to create enhanced difference information;
   a low-pass shelving filter in communication with the combined audio input and configured to modify the combined audio input as a function of frequency over a first frequency range within the combined audio input to create a first frequency corrected signal, wherein the first frequency range is approximately 20 Hz to approximately 500 Hz;
   a high-pass shelving filter in communication with the combined audio input and configured to modify the combined audio input as a function of frequency over a second frequency range within the combined audio input to create a second frequency corrected signal, wherein the second frequency range is approximately 8 kHz to approximately 20 kHz;
   an all-pass filter in communication with the combined audio input and configured to shift the phase of the combined audio input to create a third frequency corrected signal so as to compensate for phase distortion of a loudspeaker, the all-pass filter being characterized by an increased phase response at a first frequency, a zero phase response at a second frequency higher than the first frequency, and a negative phase response at a third frequency higher than the second frequency;
   a third combiner configured to combine the first frequency corrected signal, the second frequency corrected signal, and the third frequency corrected signal to create a phase compensated signal; and
   a fourth combiner configured to:
      combine the left audio input signal, the difference information, the enhanced difference information, and the phase compensated signal to create a left audio output signal, and combine the right audio input signal, the difference information, the enhanced difference information, and the phase compensated signal to create a right audio output signal.

2. The system of claim 1 wherein the all-pass filter comprises a first all-pass filter connected in series with a second all-pass filter.

3. The system of claim 1 wherein the all-pass filter comprises a first all-pass filter, a second all-pass filter, and a third all-pass filter connected in series.

4. The system of claim 1 wherein the low-pass shelving filter, the high-pass shelving filter, the all-pass filter, and the first, second, third, and fourth combiners are implemented in a digital signal processor.

5. A method for substantially correcting phase distortion of sound reproduced by at least one loudspeaker, the method comprising:
   receiving left and right audio input signals;
   combining the left and right audio input signals to produce a sum signal;
   combining the left and right audio input signals to produce a difference signal;
   enhancing the difference signal by at least modifying a frequency range of the difference signal to create an enhanced difference signal;
   low-pass filtering the sum signal with a low-pass shelving filter to modify the sum signal as a function of frequency over a first frequency range within the sum signal to create a first frequency corrected signal;
   high-pass filtering the sum signal with a high-pass shelving filter to modify the sum signal as a function of frequency over a second frequency range within the sum signal to create a second frequency corrected signal;
   all-pass filtering the sum signal to phase shift the sum signal as a function of frequency over a third frequency range within about 500 Hz to about 8 kHz within the sum signal to create a third frequency corrected signal so as to compensate for phase distortion of a loudspeaker;
   combining the first frequency corrected signal, the second frequency corrected signal, and the third frequency corrected signal to create a phase compensated signal;
   combining the left audio input signal, the difference signal, the enhanced difference signal, and the phase compensated signal to create a left audio output signal, and
   combining the right audio input signal, the difference signal, the enhanced difference signal, and the phase compensated signal to create a right audio output signal.

6. The method of claim 5 wherein the first frequency range is approximately 20 Hz to approximately 500 Hz, and wherein the second frequency range is approximately 8 kHz to approximately 20 kHz.

7. The method of claim 5 wherein all-pass filtering comprises:
   shifting the phase of the sum signal as a function of frequency over a fourth frequency range within the sum signal to create a first all-pass filter output;
   shifting the phase of the first all-pass filter output as a function of frequency over a fifth frequency range within the sum signal to create a second all-pass filter output; and
   shifting the phase of the second all-pass filter output over a sixth frequency range to create the third frequency corrected signal.

8. A phase compensation system for substantially correcting phase distortion of sound reproduced by at least one loudspeaker, the system comprising:
   means for receiving left and right audio input signals;
   means for combining the left and right audio input signals to produce a sum signal;
   means for combining the left and right audio input signals to produce a difference signal;
   means for enhancing the difference signal by at least modifying a frequency range of the difference signal to create an enhanced difference signal;
   means for low-pass filtering the sum signal with a low-pass shelving filter to modify the sum signal as a function of frequency over a first frequency range within the sum signal to create a first frequency corrected signal;
   means for high-pass filtering the sum signal with a high-pass shelving filter to modify the sum signal as a function of frequency over a second frequency range within the sum signal to create a second frequency corrected signal;
   means for all-pass filtering the sum signal to phase shift the sum signal as a function of frequency over a mid-frequency range within about 500 Hz to about 8 kHz within the sum signal to create a third frequency corrected signal so as to compensate for phase distortion of a loudspeaker;
   means for combining the first frequency corrected signal, the second frequency corrected signal, and the third frequency corrected signal to create a phase compensated signal;
   means for combining the left audio input signal, the difference signal, the enhanced difference signal, and the phase compensated signal to create a left audio output signal, and
   means for combining the right audio input signal, the difference signal, the enhanced difference signal, and the phase compensated signal to create a right audio output signal.

* * * * *